United States Patent

Murata et al.

Patent Number: 5,714,012
Date of Patent: Feb. 3, 1998

[54] SOLAR BATTERY DEVICE

[75] Inventors: Yasushi Murata, Sakado; Yoshitsugu Shibuya, Omiya; Takanori Nanya, Sayama, all of Japan

[73] Assignee: Citizen Watch Co., Ltd., Tokyo, Japan

[21] Appl. No.: 652,461
[22] PCT Filed: Dec. 14, 1994
[86] PCT No.: PCT/JP94/02101
§ 371 Date: Jun. 14, 1996
§ 102(e) Date: Jun. 14, 1996
[87] PCT Pub. No.: WO95/17015
PCT Pub. Date: Jun. 22, 1995

[30] Foreign Application Priority Data

Dec. 14, 1993 [JP] Japan ................. 5-066560 U
Oct. 5, 1994 [JP] Japan ................. 6-240451
Oct. 12, 1994 [JP] Japan ................. 6-245718

[51] Int. Cl.⁶ ............................................. H01L 31/055
[52] U.S. Cl. ......................... 136/247; 136/257; 257/435
[58] Field of Search ............................. 136/247, 257; 257/435

[56] References Cited

U.S. PATENT DOCUMENTS

| 4,153,813 | 5/1979 | Blieden et al. | 136/247 |
| 4,188,239 | 2/1980 | Boling | 136/247 |
| 4,629,821 | 12/1986 | Bronstein-Bonte et al. | 136/257 |

FOREIGN PATENT DOCUMENTS

| A-26 20 115 | 11/1977 | Germany . |
| 52-135693 | 11/1977 | Japan . |
| 53-33592 | 3/1978 | Japan . |
| 58-49860 | 3/1983 | Japan . |
| 60-147681 | 8/1985 | Japan . |
| 60-148172 | 8/1985 | Japan . |
| 60-148174 | 8/1985 | Japan . |
| 61-241983 | 10/1986 | Japan . |
| 62-187141 | 8/1987 | Japan . |
| 63-200576 | 8/1988 | Japan . |
| 5-29641 | 2/1993 | Japan . |
| 5-59311 | 3/1993 | Japan . |
| 5-287131 | 11/1993 | Japan . |

OTHER PUBLICATIONS

Patent Abstracts of Japan, vol. 10, No. 290 (P–503), 2 Oct. 1986 & JP–A–61 108988 (Sanritsu Kogyo KK) 27 May 1986.

Primary Examiner—Aaron Weisstuch
Attorney, Agent, or Firm—Armstrong, Westerman, Hattori, McLeland & Naughton

[57] ABSTRACT

A diffuse transmission layer (15) is provided on the front side of a solar battery (13), and the light entering the front side of the solar battery is diffused. A part of the light is reflected toward the front side, and another part is directed to the solar battery (13). The diffuse transmission layer (15) contains a fluorescent substance (14). The fluorescent substance (14) absorbs a predetermined wavelength band of the light incident to the front side of the solar battery and emits fluorescent light. The light generated by the fluorescent substance (14) is diffused within the diffuse transmission layer (15). A part of the light is emitted to the front side, and another part falls onto the solar battery (13). Owing to this arrangement, a bright external appearance of the device can be obtained, hiding the solar battery (13). A sufficient amount of light energy can be supplied to the solar battery (13).

14 Claims, 13 Drawing Sheets

SOLAR BATTERY DEVICE

TECHNICAL FIELD

The present invention relates to a solar battery device which uses light as an energy source.

BACKGROUND ART

Solar batteries fabricated by processing materials such as single crystal silicon, polycrystal silicon or amorphous silicon have been used as an energy source for actuating various apparatuses including watches, electronic calculators and radios.

While such solar batteries have been installed exposed to view in some apparatuses, background colors of the solar batteries are directly visible from the outside, which is disadvantageous from a standpoint of the design of the apparatuses. Particularly in the case of decorative apparatuses such as watches, design diversity thereof could be hindered by the limitation of the solar batteries, thereby affecting the value of the products. Accordingly, improvements in solar batteries have been eagerly desired.

In response to such demand for improvement, it has been proposed to arrange a color absorbing filter or a layer of coloring means to control light transmission in a specific wavelength range in front of a solar battery so as to directly conceal it from the view (see Japanese Patent Laid-Open Publication No. 5-29,641).

However, when the color absorbing filter is used, the filter per se absorbs incident light to reduce the amount of light energy supplied thereto. Consequently, it is impossible to conceal the solar battery from view while supplying sufficient light energy necessary for power generation to the solar battery.

When a colored layer is employed as described in Japanese Patent Laid-Open Publication No. 5-29,641, the solar battery can be concealed from view while supplying sufficient light energy to the solar battery. However, the aesthetic appearance of the product thus obtained is in question. That is, when a concealing effect for the solar battery is considered as the first priority, the colored layer exhibits a cloudy and weak reflection color of insufficient appearance to allow the design of products to be diverse.

It has also been proposed that a white diffusion layer and a transparent and fluorescent filter be laminated in that order in front of a solar battery to conceal the battery by the diffusion layer and to emit colored light toward the outside through the fluorescent filter (see, Japanese Patent Laid-Open Publication No. 60-148,172).

According to the above mentioned conventional technique, while the fluorescent filter per se behaves as a waveguide to laterally transmit fluorescence emitted therein, the quantity of light energy reaching the solar battery is considerably reduced, although a satisfactory concealing effect for the battery can generally be obtained. In addition, the quantity of light to be changed to fluorescence and emitted outside by means of the transparent and fluorescent filter is reduced, which inconveniently results in a dark colored appearance.

The present invention has been made in view of such technical circumstances and accordingly, it is an object of the present invention to conceal a solar battery from view while supplying sufficient light energy to the solar battery and to diversify the design of products.

DISCLOSURE OF THE INVENTION

To achieve the above mentioned object, a solar battery device in accordance of the present invention is constituted as in the following.

A solar battery device of the present invention comprises a diffuse transmission layer arranged on a front side of the solar battery device to diffuse light incident on the front side and a luminescent substance contained in the diffuse transmission layer to absorb a predetermined wavelength band of the light incident on the front side and to emit the light.

When light from the outside is incident on the above mentioned solar battery device, the light is diffused by the diffuse transmission layer, while light having a predetermined wavelength band is absorbed by the luminescent substance. Thereby the luminescent substance emits light, a portion of which is diffusively reflected in the diffuse transmission layer and emitted outside together with incident light diffusively reflected in a similar manner so as to lighten the product's appearance. On the other hand, the other portion of light emitted by the luminescent substance reaches the solar battery together with incident light diffusively transmitted and contributes to power generation in the solar battery.

The luminescent substance may be, for example, constituted of either one or both of a fluorescent material and a phosphorescent material.

It is possible to increase the quantity of light energy supplied to the solar battery by means of the luminescent substance, when a wavelength band to be absorbed by the fluorescent material or the phosphorescent material is adjusted to that of light which does not contribute to power generation by the solar battery, while a wavelength band of luminescent light is adjusted to that of light which contributes to the power generation. In general, while power generation in the solar battery is caused by visible light, a material that absorbs UV light and emits visible light may be used as the luminescent substance.

It is possible to display appearance colors of any tone or luster with various lightness, hues, and saturations by selecting a luminescent material from a viewpoint of the wavelength of the emitted light. Patterns may be displayed by combining luminescent substances which emit different colors. Thus, the degree of freedom to design the appearance of apparatuses is widened, thereby improving aesthetic value of apparatuses while applying such designs to, for example, decorative articles.

Further, according to the present invention, a similar effect can be obtained when a layer of luminescent substance comprising a similar material (but which should be opaque) is arranged at an arbitrary position on the front side of the solar battery instead of containing the luminescent substance in the diffuse transmission layer.

It has been known that oxygen radicals as a by-product of UV light irradiation in a fluorescent or phosphorescent material react with an end group of such a material to inhibit luminescence or promote yellowing degradation thereof.

It is thus preferable to add a hindered amine light stabilizer to the fluorescent or phosphorescent material. The hindered amine light stabilizer absorbs light having a wavelength of 250 nm or less and transmits that of more than 250 nm, and further functions to capture and inactivate the oxygen radicals in the added substances. Accordingly, the above mentioned problems can be solved.

On the other hand, a UV light shielding layer may be formed on the front side of the diffuse transmission layer which contains the luminescent substance to absorb a part of UV light externally incident so as to prevent degradation thereof by means of the UV light shielding layer.

The present invention may also be constituted so that a shielding layer is additionally arranged at the front side of the solar battery to shield reflecting light in the solar battery.

While the shielding layer prevents the reflecting light from being emitted outside, the solar battery is concealed from view more effectively due to the shielding layer thus arranged.

The shielding layer has an anisotropic transmission characteristic which shows different transmittances depending on the direction of incident light. Thus, the present invention may also be constituted so that the quantity of light to be transmitted from the front side to the side of the solar battery side is greater than that of light transmitted from the side of the solar battery to the front side.

Preferably, the shielding layer has an optical transmittance of 60 to 96% for the incident light on the front side.

Such a shielding layer may be obtained by, for example, three-dimensionally machining a front portion of a colorless transparent plate member.

Because of the above mentioned constitution of the present invention, the solar battery can be concealed from view while functioning as a battery and displaying various bright colors of higher quality of appearance. Accordingly, the degree of freedom to design apparatuses is greatly improved, which allows the solar battery to be applied to wider purposes than the conventional one.

BEST MODE FOR CARRYING OUT THE INVENTION

Preferred embodiments of the present invention will be described hereinafter with reference to the accompanying drawings.

First Embodiment

Figure 1:
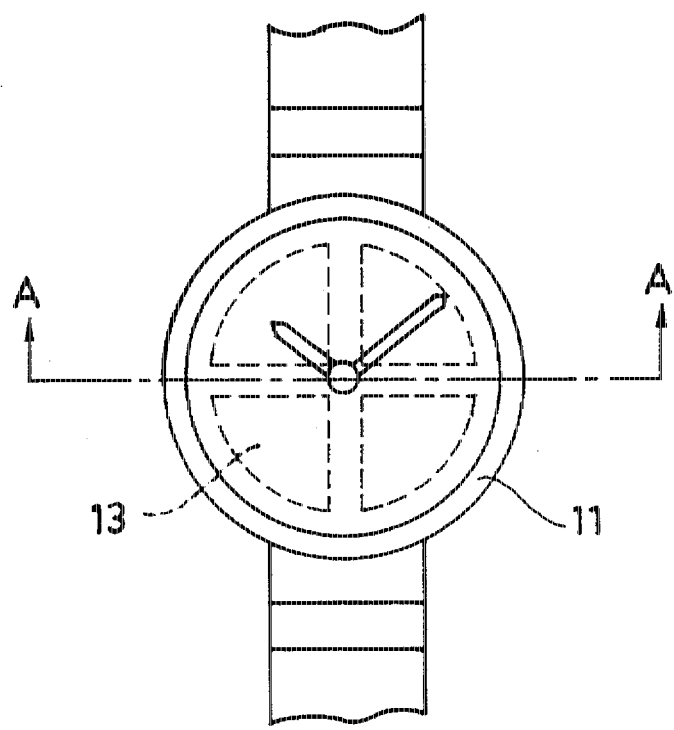
FIG. 1 is a typical front view of a wristwatch provided with a solar battery device of a first embodiment according to the present invention.
Figure 2:
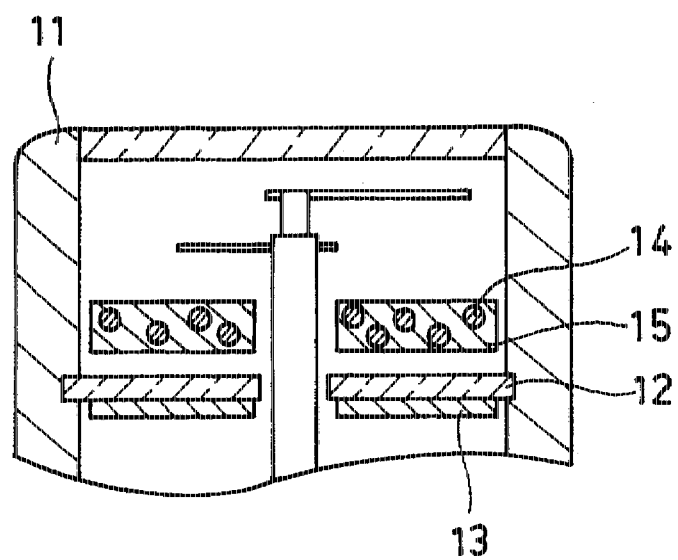
FIG. 2 is a typical sectional view taken on line A—A in FIG. 1 showing the structure of the wristwatch arranged on the front side of the solar battery.

FIG. 1 is a typical front view of a wristwatch provided with a solar battery device of a first embodiment according to the present invention having a solar battery divided into four parts and arranged on the inside of a dial plate. FIG. 2 is a typical sectional view taken on line A—A in FIG. 1 showing the structure of the wristwatch arranged on the front side of the solar battery.

A glass substrate 12 is fixedly held by the inner surface of a case frame 11. A solar battery 13 is formed on the back surface of the glass substrate 12 by forming an amorphous silicon film by a plasma CVD process. On the other hand, a diffuse transmission layer 15 which contains a fluorescent substance 14 is formed on the front side of the glass substrate 12, the diffuse transmission layer 15 also being used as a dial face to constitute a solar battery wristwatch.

As the fluorescent substance 14, there may be used various kinds of fluorescent substances which absorb UV light and emit visible light, or absorb visible light having a wavelength of 500 nm or less and emit visible light longer than 500 nm. For example, a fluorescent whitening dye of 4,4'-diaminostilbene-2,2'-disulfonate derivatives (luminescent center wavelength of 430 nm) and Rhodamine B (luminescent center wavelength of 580 nm) were used as the fluorescent substance 14 in the first embodiment.

The diffuse transmission layer 15 can be easily formed by mixing calcium carbonate, etc. in a transparent resin material or dispersing a light scattering material in the transparent material.

The quantity of both light absorption and fluorescent emission increases with an increase in the content of the fluorescent substance 14 in the diffuse transmission layer 15. When the content exceeds a certain concentration, however, fluorescence thus emitted is absorbed by neighboring fluorescent molecules, thereby reducing the quantity of fluorescent emission as a whole. This phenomenon is generally known as concentration quenching.

The limiting concentration where the concentration quenching begins is dependent on the specific kind of the fluorescent substance. Preferably, the diffuse transmission layer 15 contains the fluorescent substance 14 in an amount falling in the range where no concentration quenching occurs.

In the first embodiment, 0.5% by weight of the above mentioned fluorescent substance 14 was added to a transparent methyl methacrylate resin. The concentration quenching was not observed at this concentration.

On the other hand, the optical transmittance of the diffuse transmission layer 15 can be arbitrarily controlled by the method for preparing thereof. Calcium carbonate in an amount of 2.0% by weight was mixed in to the methyl methacrylate resin to form a sheet 0.5 mm thick in the first embodiment.

The thus prepared diffuse transmission layer 15 which contains the fluorescent substance 14 was superposed on the solar battery 13 to determine the light energy which falls on the solar battery 13 located thereunder by means of an electromotive force characteristic.

A concealing effect of the solar battery 13 and the quality of its appearance were also evaluated. As a typical example, the diffuse transmission layer 15 of the methyl methacrylate resin which contains 2.0% by weight of calcium carbonate was compared with conventional one.

The quantity of light energy which falls on the solar battery 13 is dependent on the fluorescent color emitted by the fluorescent substance 14, thereby varying the electromotive force characteristic of the solar battery 13. The correlation between the concealing effect of the solar battery 13 and the quality of appearance was not dependent on the fluorescent color and has substantially the same tendency.

The solar battery device was evaluated in comparison with the following arrangements;

Conventional example 1: of a solar battery alone;

Comparative examples 1-1 (white filter) and 1-2 (yellow filter): arrangement comprising a solar battery and an optically diffusing absorption filter arranged on the front side of the solar battery;

Comparative example 1-3: constitution comprising a color layer means (interference filter) which includes a diffuse transmission layer arranged on the front side of a solar battery as described in Japanese Patent Laid-Open Publication No. 5-29,641; and Comparative example 1-4: constitution comprising a color diffuse layer (transparent fluorescent filter) which includes a white diffuse plate arranged on the front side of a solar battery as described in Japanese Patent Laid-Open Publication No 60-148,172.

An electromotive force of 2.50 V or more was regarded as a standard level for acceptance of the electromotive force characteristic under a condition of ordinary indoor illumination (200 Lux-fluorescent lighting) using five series-connected photoelectric cells. Results of evaluation are shown in Table 1.

As is obvious from Table 1, the conventional example and each of the comparative examples are unable to simultaneously satisfy all of requirements for enhancing the electromotive force of the solar battery, the concealing effect for the solar battery, and the quality of appearance. According to the first embodiment of the present invention, however, the solar battery is concealed satisfactorily while obtaining an electromotive force falling in an effective range, and the appearance has an excellent quality, which enables an excellent design without paying any attention at all to the appearance of the solar battery 13.

TABLE 1

|  | Electromotive force of solar battery (V) | Electomotive force characteristic | Appearance concealing of solar battery | Quality of appearance |
|---|---|---|---|---|
| Conventional Example 1 | 2.67 | ○ | X | X |
| Comparative Example 1-1 (white) | 2.42 | X | ○ | ○ |
| Comparative Example 1-2 (yellow) | 2.44 | X | ○ | ○ |
| Comparative Example 1-3 | 2.54 | ○ | Δ | X |
| Comparative Example 1-4 (yellow) | 2.48 | Δ | ○ | X |
| First Embodiment (white) | 2.52 | ○ | ○ | ○ |
| First Embodiment (yellow) | 2.56 | ○ | ○ | ○ |

○ = Acceptable
X = Not Acceptable
Δ = Close to results of the first embodiment, but still not in the acceptable range The effect of the structural difference between the first embodiment and each of the comparative examples on the quality of appearance was then evaluated.

The quality of the optical transmittance of the diffuse transmission layer 15 alone in the first embodiment was estimated by means of an illumination meter and the electromotive force characteristic of the solar battery 13, and increased sensitization of the fluorescent substance 14 contained in the diffuse transmission layer 15 was studied.

Results of examination showed that the quantity of light supplied to the solar battery 13 is less when the diffuse transmission layer 15 does not contain the fluorescent substance 14, compared with a similar layer which contains such a substance. The reason is that the solar battery 13 is sensitized due to the wavelength-changing function of the fluorescent substance 14, i.e., light falling within a less sensitive wavelength band of the solar battery 13 is changed by the fluorescent substance 14 to light falling within a more sensitive one.

The above mentioned wavelength-changing function is used to select the proper kind of the fluorescent substance 14, which enables the sensitization of the solar battery to be optimized depending on the wavelength distribution of the incident light. For example, a fluorescent lamp of three-bright line type used as typical room lighting has intense output peaks at wavelengths of 440 nm, 510 nm, and 580 nm. Accordingly, the sensitization of the solar battery 13 is enhanced by the fluorescent substance 14 which absorbs light to which the solar battery 13 is less sensitive (a wavelength band of 440 nm or less) and emits light to which it is more sensitive (a wave length band falling within the range of 550 nm to 600 nm).

When the incident light enters from outside and falls on the diffuse transmission layer 15 which contains the fluorescent substance 14 in the first embodiment, light having a wavelength falling within a wavelength band which the fluorescent substance 14 is capable of absorbing is absorbed therein, is changed to light having a longer wavelength and is emitted from the fluorescent substance 14.

In the solar battery device structure of the first embodiment according to the present invention, there is used the fluorescent substance 14 which absorbs UV light to which an amorphous silicon-solar battery 13 lacks photosensitivity, and emits visible light, or which absorbs visible light to which the amorphous silicon-solar battery 13 has a lower photosensitivity (having wavelength of 500 nm or less) and emits visible light of longer wavelength (having a higher wavelength over 500 nm).

Figure 3:
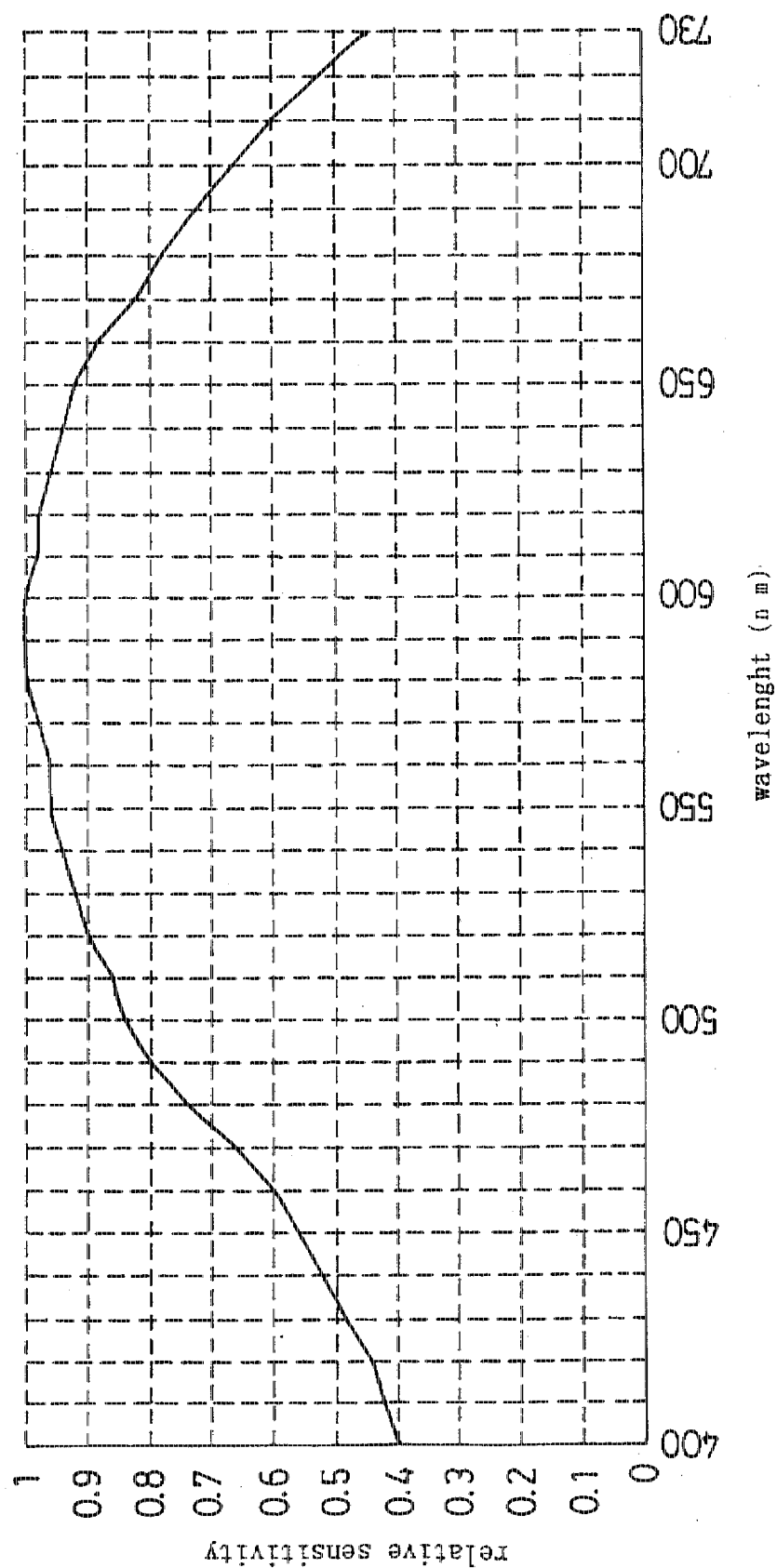
FIG. 3 is a graph showing the spectral sensitivity of the amorphous silicon solar battery used in FIG. 1.

Spectral sensitivity of the amorphous silicon-solar battery 13 is shown in FIG. 3.

In the first embodiment according to the present invention, light having wavelengths absorbed by the fluorescent substance 14 is changed to light having wavelengths which contribute to power generation in the solar battery 13 are is then allowed to fall thereon. Accordingly, the decrease in electromotive force characteristic of the solar battery 13 is less compared with the comparative examples 1-1 and 1-2 in which an absorption filter is used.

When the quantum efficiency of the fluorescent substance 14 is excessively low, however, the increased sensitization of the solar battery 13 due to the wavelength-changing function of the fluorescent substance 14 is not exhibited. Preferably, the quantum efficiency of the fluorescent substance 14 is relatively high. Further, light emitted from the fluorescent substance 14 is also emitted towards the front side (user's side) in the first embodiment, thereby making a clear and bright fluorescence visible to the user.

The above mentioned structure of the first embodiment is quite different from that of the comparative example 1-3 from the viewpoint of quality of appearance. In the comparative example 1-3, light reflected from the interference filter is diffused by a diffuse transmission layer to be seen. However, while the diffuse transmission layer is also used to conceal a solar battery, the transmitting performance thereof is reduced and, in addition, the color of appearance fades when the concealing effect is exhibited. As a result, it is impossible for such a structure of the comparative example 1-3 to improve the quality of appearance.

According to the structure of comparative example 1-4, fluorescence per se, emitted from a transparent fluorescent filter, behaves as a waveguide passage so that light is transmitted along a surface of the fluorescent filter to exit out of a side end surface thereof. Accordingly, the quantity of fluorescence emitted to a solar battery side and a viewer's side is insufficient, which reduces the electromotive force characteristic and the quality of appearance.

Second Embodiment

A solar battery device of a second embodiment according to the present invention will be described in the following with reference to FIGS. 4 and 5.

Figure 4:
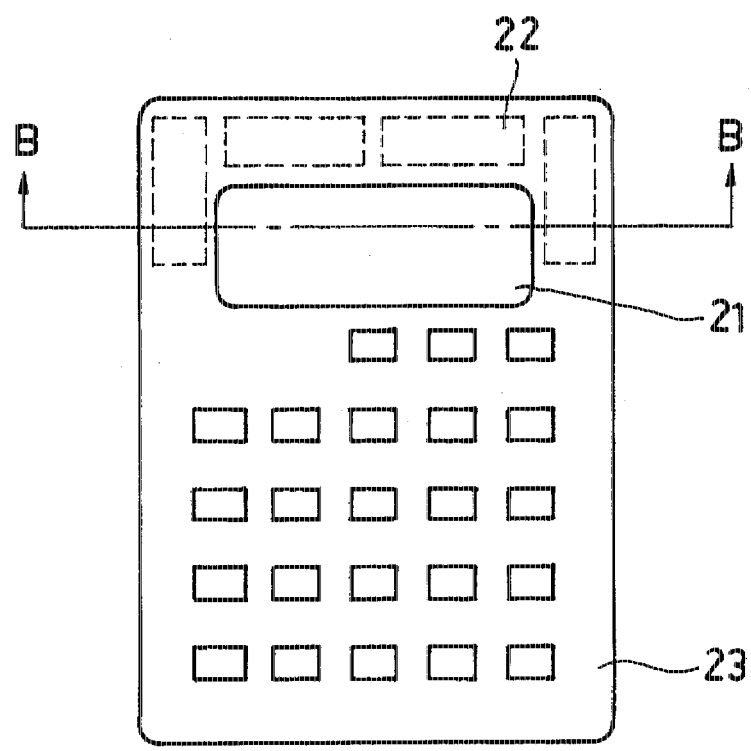
FIG. 4 is a typical front view of an electronic calculator provided with a solar battery device of a second embodiment according to the present invention.
Figure 5:
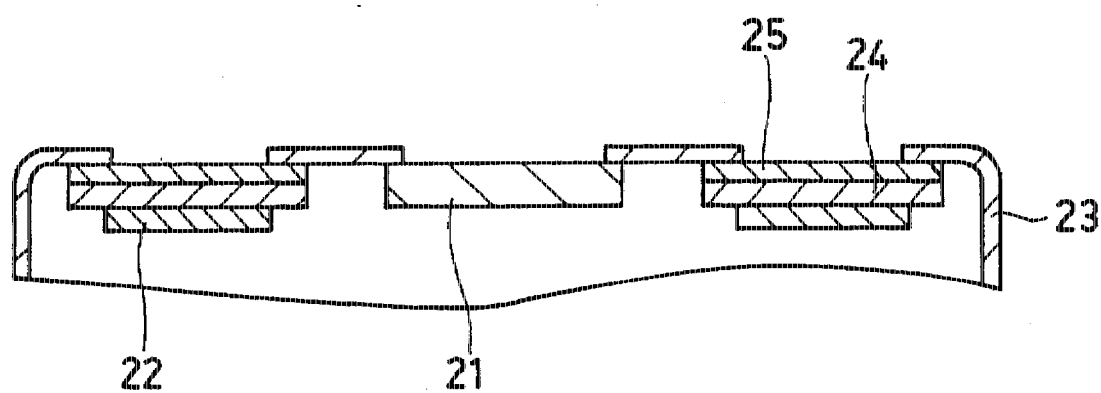
FIG. 5 is a typical sectional view taken on line B—B in FIG. 4 showing the structure of the electronic calculator on the front side of the solar battery.

FIG. 4 is a typical front view of an electronic calculator incorporating the solar battery device in the second embodiment according to the present invention, in which the solar battery device is arranged on an outer periphery of a display portion 21. FIG. 5 is a typical sectional view taken on line B—B in FIG. 4 showing the structure of the electronic calculator arranged on the front side of the solar battery.

In the second embodiment, the display portion 21 and the solar battery 22 are fixed to an opening of a frame 23 of the electronic calculator from the inside thereof. A fluorescent layer 24 and a diffuse transmission layer 25 are laminated over the solar battery 22 to constitute the solar battery device.

More concretely, a methyl methacrylate resin mixed with 2.0% by weight of calcium carbonate powder is molded to form the diffuse transmission layer 25 which is 0.5 mm thick, similar to the first embodiment, which is then coated on the back surface (surface facing the solar battery side) with a fluorescent whitening dye of a coumarin derivative in a thickness of about 5 μm as the fluorescent layer 24 to form the above mentioned constitution. The layer of fluorescent whitening dye is bonded to the back surface by a binder having a low transparency e.g., an opague luminescent layer.

When the solar battery device thus constituted was evaluated in the same manner as described in the first embodiment, a practically similar effect was obtained. Further, when the fluorescent layer 24 was formed on the front side (surface facing to the opposite side of the solar battery) of the diffuse transmission layer 25 in the solar battery device of the second embodiment, a similar effect was also obtained.

However, when the fluorescent layer 24 is transparent in the second embodiment, the fluorescent light is laterally transmitted in the layer per se similarly as in the above mentioned comparative example 1-4 to considerably reduce the quantity of incident fluorescent light entering the solar battery 22. Accordingly, it is preferable to employ a fluorescent layer 24 having a small transparency.

Total optical transmittance of the diffuse transmission layer 25 and the fluorescent layer 24 was changed so as to determine an applicable range of the solar battery device.

Calcium carbonate powder as a diffuse transmissive material is mixed in a transparent methyl methacrylate resin to form the diffuse transmission layer 25, one surface of which is then coated with a mixture prepared by mixing fluorescent whitening dye of a coumarin derivative, a binder, and acetone in a weight ratio of 1:1:10, followed by a spin-coating method to form the fluorescent layer 24 of about 5 μm in thickness.

The optical transmittance of the diffuse transmission layer 25 was controlled by the concentration of calcium carbonate in the resin (0.1 to 10.0% by weight). The specimen was superposed on the solar battery 22 so that the fluorescent layer 24 was arranged on the front side the solar battery 22. The useful range of the solar battery device was examined from the viewpoints of electromotive force characteristic and concealing performance of the solar battery 22 by determining the total optical transmittance using an illumination meter. As to the electromotive force characteristic of the solar battery, an electromotive force of 2.50 V or more was regarded as a standard level for acceptance under a condition of 200 Lux-fluorescent lamp using five series-connected photoelectric cells.

As a result, the electromotive force characteristic of the solar battery 22 exceeded the standard level for acceptance when the total optical transmittance of the diffuse transmission layer 25 and the fluorescent layer 24 was more than 40%. The more the total optical transmittance increases, the more the electromotive force characteristic is improved. As to the concealing performance of the solar battery 22, however, it was observed that a total optical transmittance of 85% or more did not yield a satisfactory result.

Therefore, the total optical transmittance of the diffuse transmission layer 25 and the fluorescent layer 24 preferably falls in the range of 40% to 85%.

According to the solar battery devices described in the first and the second embodiments, the existence of the solar battery can be concealed from outside view and thus the battery may be arranged in any remaining space which has not been previously utilized conventionally because of design restrictions.

Although a diffuse transmission layer 15 which contains the fluorescent substance 14 is shown in the first embodiment, a similar concealing effect can be obtained by a constitution in which the fluorescent substance 14 is mixed in a transparent material followed by processing one or both surfaces thereof to form the diffuse transmission layer 15.

When the diffuse transmission layer 15 is prepared in the first embodiment, a material for imparting a diffuse transmitting function (calcium carbonate) and the fluorescent substance 14 are mixed separately. However, the diffuse transmission layer 15 can be prepared more easily if a fluorescent pigment is dispersed in the transparent material, whereby both diffuse transmitting and fluorescent properties can be imparted at the same time.

While the fluorescent substance 14 or the fluorescent layer 24 is used as a constituent in the first or the second embodiments, instead, a phosphorescent substance or a phosphorescent layer which emits phosphorescence caused by incident light may be used as the constituent.

There may be used stilbene derivatives, Rhodamine B and coumarin derivatives, as well as various kinds of luminescent materials which absorb UV light and emit visible light or which absorb visible light having wavelengths of 500 nm or less and emit visible light having wavelengths over 500 nm as the fluorescent or the phosphorescent materials.

These fluorescent or phosphorescent materials include, for example, perylene and its derivatives, oxazole derivatives, naphthalimide compounds, Rhodamine G, salicylaldazine, dixanthylene, anthrapyrimidine derivatives, anthraquinone derivatives, $YVO_4$:Sm, $Y_2O_3$:Ho; a ternary complex of rare earth ion, β-diketone and 1,10-phenanthroline; a ternary complex of rare earth ion, β-diketone and trioctylphosphine oxide; and the like.

While methyl methacrylate resin mixed with calcium carbonate is used as the diffuse transmission layers 15 and 25 in the first and the second embodiments, other plastic materials or white powder may be employed. Instead of mixing the white powder in the resin, the diffuse transmission layers 15 and 25 may also be prepared by a process in which a surface of transparent glass or a resin is subjected to a honing treatment, or processed to form a fisheye-, lenticular- or Fresnel-lens shape or to form a fine prism-like layer on the surface.

Further, the diffuse transmission layers 15 and 25 may be prepared by modifying a surface of plastics or formed from a resin having diffuse transmitting properties due to the molecular structure thereof, such as Teflon or Derlin (polyacetal).

In the solar battery device according to the present invention, the diffuse transmission layer which contains the fluorescent or the phosphorescent substance, or a laminate of the diffuse transmission layer and the fluorescent layer (or the phosphorescent layer) can be molded into thin layer, which is sufficiently storable in a space of several hundreds of μm and is thus not restricted by any thickness limitations relating to the space for arrangement. Further, the solar battery can be concealed from outside view, which enables an excellent design without paying any attention at all to the appearance of the solar battery.

Third Embodiment

A solar battery device of a third embodiment according to the present invention will be described in the following with reference to FIGS. 6 and 7.

Figure 6:
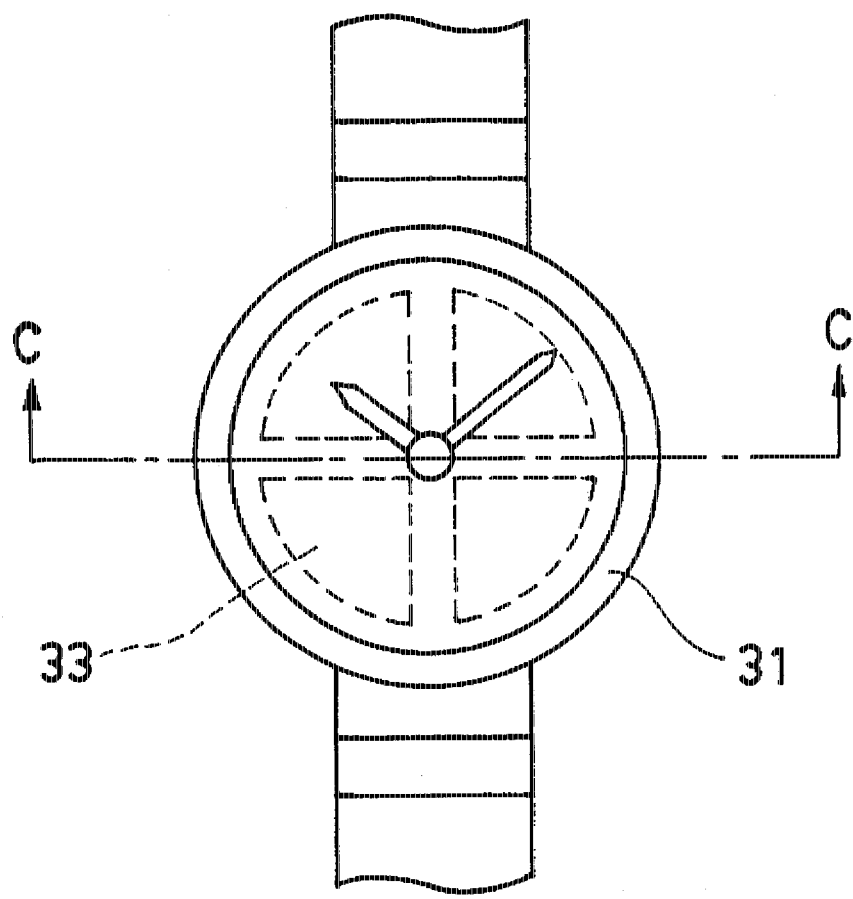
FIG. 6 is a typical front view of a wristwatch provided with a solar battery device of a third embodiment according to the present invention.
Figure 7:
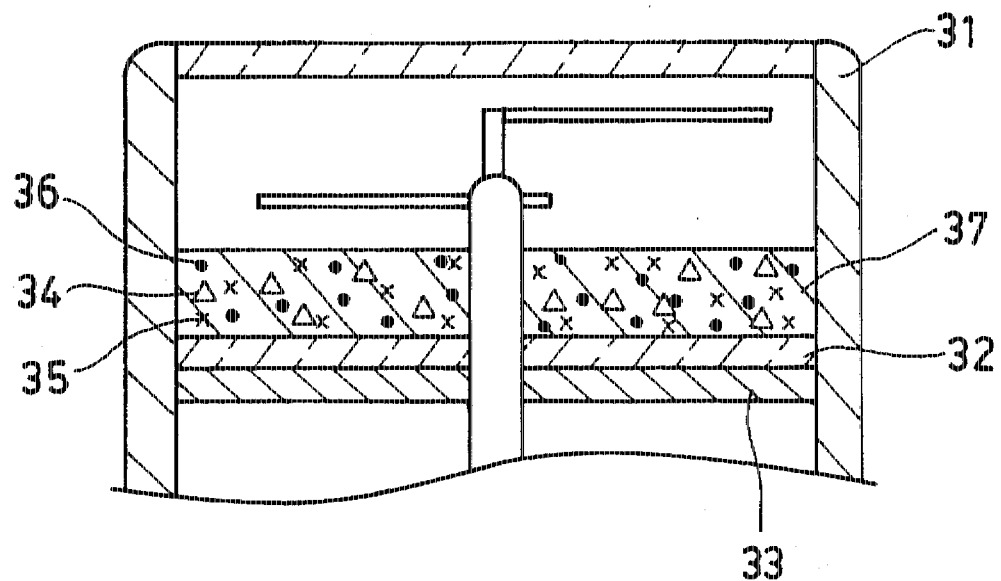
FIG. 7 is a typical sectional view taken on line C—C in FIG. 6 showing the structure of the wristwatch arranged on the front side of the solar battery.

FIG. 6 is a typical front view of a wristwatch provided with a solar battery device of a third embodiment according to the present invention having a solar battery divided into four parts and arranged on the inside of a dial plate. FIG. 7 is a typical sectional view taken on line C—C in FIG. 6 showing the structure of the wristwatch arranged on the front side of the solar battery.

A glass substrate 32 is fixedly held by the inner surface of a case frame 31. A solar battery 33 is formed on the back surface of the glass substrate 32 by depositing an amorphous silicon film by a plasma CVD process. On the other hand, a diffuse transmission layer 37 which contains a fluorescent substance 34, a hindered amine light stabilizer 35, and a light scattering substance 36 is formed on the front side of the glass substrate 32, while the diffuse transmission layer 37 is also used as a dial face to constitute a solar battery wristwatch.

A transparent epoxy resin was used as the diffuse transmission layer 37 in the third embodiment. There was added 1.0% by weight of titanium dioxide particles having an average particle size of 1 μm as the light scattering substance 36 to the diffuse transmission layer 37. Further, there were added 0.5% by weight of a fluorescent dye (emission center wavelength: 430 nm) of stilbene bisbenzoxazole derivatives which absorb UV light and emit visible light, and Rhodamine B (emission center wavelength: 580 nm) which absorbs visible light having wavelengths of 500 nm or less and emits visible light having wavelengths over 500 nm as the fluorescent substance, respectively, to the diffuse transmissive layer 37. Furthermore, 0.5% by weight of bis (2,2,6,6-tetramethyl-4-piperidyl) sebacate as the hindered amine light stabilizer 35 was added to the diffuse transmission layer 37. The diffuse transmission layer 37 with the thus added above mentioned substances was molded to form a sheet of 0.5 mm in thickness.

COMPARATIVE EXAMPLE 3

In order to confirm effects obtained by the third embodiment, as a comparative example 3, there was used a diffuse transmissive layer prepared by adding the same amount of the substances as those used in the third embodiment except the hindered amine light stabilizer, followed by molding to form the same sized sheet.

The diffuse transmissive layer of the third embodiment and the comparative example 3 were superposed on the front side of the solar battery 33, respectively, to evaluate the quantity of light energy which falls on the solar battery 33 from the front side according to an electromotive force characteristic.

An electromotive force of 2.50 V or more was regarded as a standard level for acceptance of the electromotive force characteristic under a condition of ordinary indoor illumination (200 Lux-fluorescent lighting) using five series-connected photoelectric cells. In addition, the concealing effect of the solar battery 33 and the weather resistance of the solar battery device were also evaluated. The solar battery device was exposed to a carbon arc having wavelengths of 350 nm to 450 nm for 100 hours continuously using a sunshine weather meter and was evaluated by means of the gray scale for contamination prescribed by ISO 105-A03. A color chart number of 4–5 or more was regarded as a standard level for acceptance.

The results of evaluation are shown in Table 2. As the quantity of light energy which falls on the solar battery 33 is varied depending on the fluorescent color emitted by the fluorescent substance 34 contained in the third embodiment and the comparative example 3, the electromotive force characteristic of the solar battery 33 is changed. On the other hand, the correlation between the concealing effect of the solar battery 33 and the quality of appearance is not dependent on the fluorescent color and has substantially the same tendency.

Enhancement of the electromotive force and the appearance concealment of the solar battery in the third embodiment and the comparative example 3 exceeded the standard level for acceptance and showed little difference between these two cases. As for weather resistance, however, a color chart number of 4–5 or more was obtained in the third embodiment when the gray scale for contamination was evaluated after 100 hours continuous exposure to the carbon arc of the sunshine weather meter, while the color chart number was 3 or less in the comparative example 3 in which the hindered amine light stabilizer was not added. The third embodiment showed a great improvement in weather resistance.

TABLE 2

|  | Electromotive force of solar battery (V) | Electromotive force characteristic | Appearance concealment | Gray scale color chart number | Weather resistance |
| --- | --- | --- | --- | --- | --- |
| Third Embodiment (white) | 2.52 | ○ | ○ | more than 4–5 | ○ |
| Third Embodiment (yellow) | 2.56 | ○ | ○ | more than 4–5 | ○ |
| Comparative Example 3 (white) | 2.54 | ○ | ○ | 3 | X |
| Comparative Example 3 (yellow) | 2.52 | ○ | ○ | 2–3 | X |

○ = Acceptable
X = Not Acceptable

Fourth Embodiment

A solar battery device of a fourth embodiment according to the present invention will be described in the following with reference to FIGS. 8 and 9.

Figure 8:
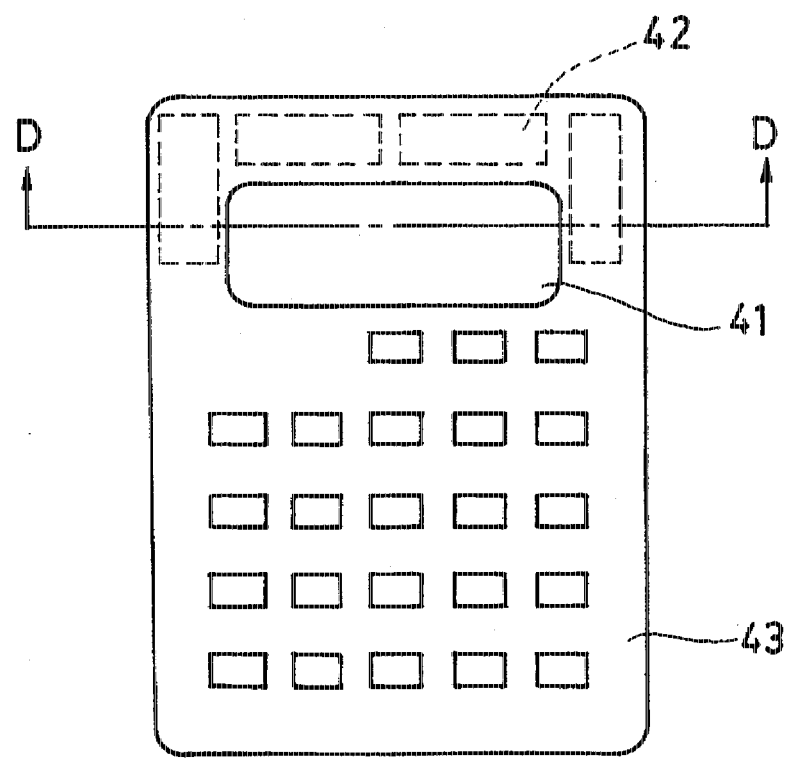
FIG. 8 is a typical front view of an electronic calculator provided with a solar battery device of a fourth embodiment according to the present invention.
Figure 9:
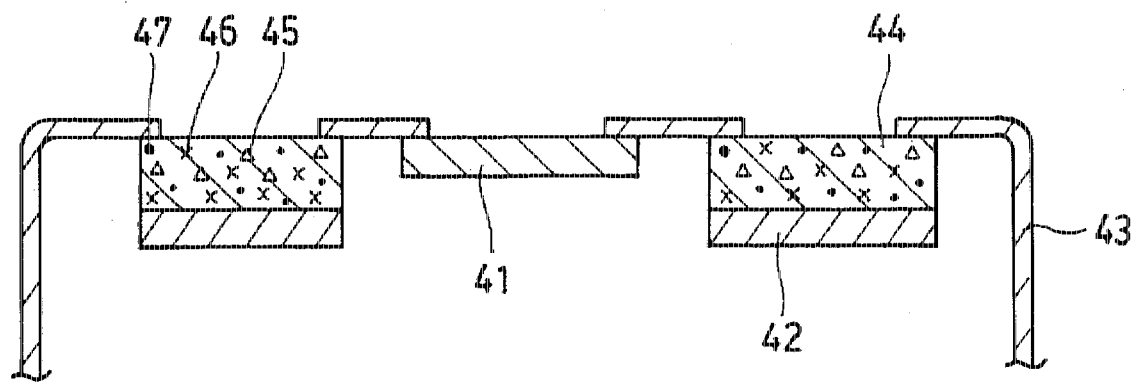
FIG. 9 is a typical sectional view taken on line D—D in FIG. 8 showing the structure of the electronic calculator on the front side of the solar battery.

FIG. 8 is a typical front view of an electronic calculator incorporating the solar battery device in the fourth embodiment according to the present invention, in which the solar battery 42 divided into four parts is arranged so as to surround an outer periphery of a display portion 41. FIG. 9 is a typical sectional view taken on line D—D in FIG. 8 showing structure of the electronic calculator arranged on the front side of a solar battery.

In the fourth embodiment, the display portion 41 and the solar battery 42 are fixed to an opening of a frame 43 of the electronic calculator from the inside thereof. A diffuse transmissive layer 44 was laminated on the solar battery 42 to form the solar battery device. A fluorescent substance 45, a hindered amine light stabilizer 46, and light scattering substance 47 are added to the diffuse transmission layer 44.

More concretely, a methyl methacrylate resin was used as the matrix of the diffuse transmission layer 44. A fluorescent dye (emission center wavelength: 430 nm) of 4,4'-diaminostilbene-2,2'-disulfonic acid derivatives was used as the fluorescent substance and added in an amount of 0.5% by weight to the diffuse transmission layer 44. Bis (2,2,6,6-tetramethyl-4-piperidyl) sebacate was used as the hindered amine light stabilizer 46 and added in an amount of 0.5% by weight to the diffuse transmission layer 44. Titanium dioxide particles having an average particle size of 1 μm were used as the light scattering substance 47 and were added in an amount of 1.0% by weight to the diffuse transmission layer 44.

When the solar battery device thus constituted was evaluated in the same manner as described in the third embodiment, a practically similar effect was obtained.

In order to examine the applicable range of the solar battery 42, the optical transmittance of the diffuse transmission layer 44 was changed by varying the concentration of the light scattering substance 47 added to the layer 44 in the fourth embodiment.

Concentration of the titanium dioxide particles having an average particle size of 1 μm in an epoxy resin was varied in the range of 0.05% by weight to 10.0% by weight to control the optical transmittance of the diffuse transmissive layer 44.

More concretely, the diffuse transmission layer 44 was superposed on the solar battery 42 to examine the applicable range of the solar battery 42 from the standpoints of an electromotive force characteristic and the concealing performance thereof by determining the optical transmittance using an illumination meter. An electromotive force of 2.50 V or more was regarded as a standard level for acceptance of the electromotive force characteristic of the solar battery 42 under a fluorescent lighting condition of 200 Lux using five series-connected photoelectric cells.

Results of examination showed that the standard level of 2.50 V or more was obtained when the optical transmittance of the diffuse transmission layer 44 was over 40% and the electromotive force characteristic was improved with an increase in the optical transmittance. As for the concealing performance of the solar battery 42, it was found that the quality of appearance was unsatisfactory when the optical transmittance exceeded 85%. Accordingly, it is preferable that the optical transmittance of the diffuse transmissive layer 44 is in the range of 40% to 85%.

While the fluorescent substance 45 is added to the diffuse transmission layer 44 in the third and the fourth embodiments, a phosphorescent substance which absorbs light and emits phosphorescence may be added instead.

There may be used stilbene bisbenzoxazole derivatives, Rhodamine B and stilbene derivatives, as well as various kinds of luminescent substances which absorb UV light and emit visible light or which absorb visible light having a wavelength of 500 nm or less and emit visible light having a wavelength greater than 500 nm as the fluorescent or the phosphorescent substance.

There may be used, for example, 2,5-bis[5'-t-butylbenzoxazolyl (2)]thiophene, perylene, perylene derivatives, coumarin derivatives, oxazole derivatives, naphthalimide compounds, Rhodamine G, salicylaldazine, dixanthylene, anthrapyrimidine derivatives, anthraquinone derivatives, YVO$_4$:Sm, Y$_2$O$_3$:Ho; a ternary complex of rare earth ion, β-diketone and 1,10-phenanthroline; a ternary complex of rare earth ion, β-diketone and trioctylphosphine oxide; and the like.

While bis (2,2,6,6,-tetramethyl-4-piperidyl) sebacate was used as the hindered amine light stabilizers 35 and 46 in the third and the fourth embodiments, there may also be used any compound having a structure in which all hydrogen atoms bonded to the 2- and 6-position carbon atoms of piperidine are substituted by methyl groups, such as bis (1,2,2,6,6-pentamethyl-4-piperidyl) sebacate, 1-[2-{3-(3,5-di-t-butyl-4-hydroxyphenyl) propionyloxy}ethyl]-4-[3-(3,5-di-t-butyl-4-hydroxyphenyl) propionyloxy]-2,2,6,6-tetramethylpiperidine, 4-benzoyloxy-2,2,6,6-tetramethylpiperidine, 8-acetyl-3-dodecyl-7,7,9,9-tetramethyl-1,3,8-triazaspiro [4.5] decane-2,4-dione, dimethyl succinate 1-(2-hydroxyethyl)-4-hydroxy-2,2,6,6-tetramethylpiperidine, poly [{6-(1,1,3,3-tetramethylbutyl) amino-1,3,5-triazine-2,4-diyl} {(2,2,6,6-tetramethyl-4-piperidyl) imino} hexamethylene {(2,2,6,6-tetramethyl-4-piperidyl) -imino}], N,N'-bis (3-aminopropyl) ethyleneamine 2,4-bis [N-butyl-N- (1,2,2,6,6-pentamethyl-4-piperidyl) amino] -6-chloro-1,3,5 triazine, 2- (3,5-di-t-butyl-4-hydroxybenzyl) -2-n-butylmalonate bis (1,2,2,6,6- pentamethyl-4-piperidyl), 1,2,2,6,6-pentamethyl-4-piperidyl/tridecyl 1,2,3,4-butanetetracarboxylate and the like.

While a transparent epoxy resin and a methyl methacrylate resin were used as the matrix of the diffuse transmissive layers 37 and 44, and titanium dioxide particles having an average particle size of 1 μm were employed as the light scattering substances 36 and 47 in the third and fourth embodiments, the diffuse transmission layers and the light scattering substances are not restricted by the above mentioned materials.

Instead of the epoxy resin and the methyl methacrylate resin, a transparent plastic material such as polystyrene, polycarbonate, polyethylene terephthalate, etc. may be used as the matrix of the diffuse transmission layers 37 and 44. Instead of the titanium dioxide particles, white powder of calcium carbonate, magnesium fluoride, etc. may be used, while the powder may have an arbitrary particle size which is not limited to the average particle size of 1 μm.

Further, while the fluorescent substances 34 and 45 as well as hindered amine light stabilizers 35 and 46 were added to the diffuse transmission layers 37 and 44 in the construction of the third and the fourth embodiments, the fluorescent substances 34 and 45 as well as the hindered amine light stabilizers 34 and 46 may be formed in a layer different from the diffuse transmission layers 37 and 44.

Instead of mixing the white powder in the resin, the diffuse transmission layers 37 and 44 may also be formed by a construction in which a surface of transparent glass or a resin is subjected to a honing treatment, or processed to form a fisheye-, lenticular- or Fresnel-lens shape or to form a fine prism-like layer on the surface.

Further, the diffuse transmissive layers 37 and 44 may be prepared by modifying a surface of plastics or formed from a resin having diffuse transmitting properties due to its molecular structure thereof, such as Teflon or polyacetal.

As the concentration quenching would occur similarly as described in the first and the second embodiment when the added amount of the fluorescent substances 34 and 45 is increased, the added amount thereof should be controlled by considering the concentration limit of the concentration quenching. The concentration quenching did not occur with the concentration used in the third and the fourth embodiments.

Fifth Embodiment

A solar battery device of a fifth embodiment according to the present invention will be described in the following with reference to FIGS. 10 and 11.

Figure 10:
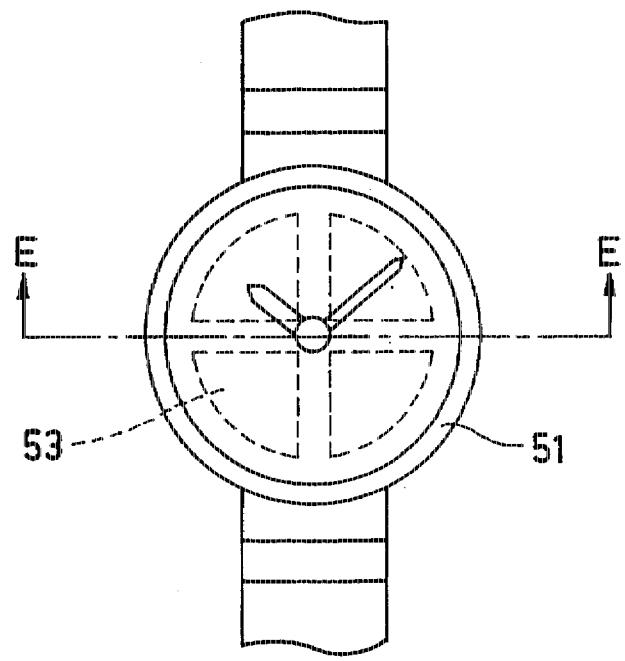
FIG. 10 is a typical front view of a wristwatch provided with a solar battery device of a fifth embodiment according to the present invention.
Figure 11:
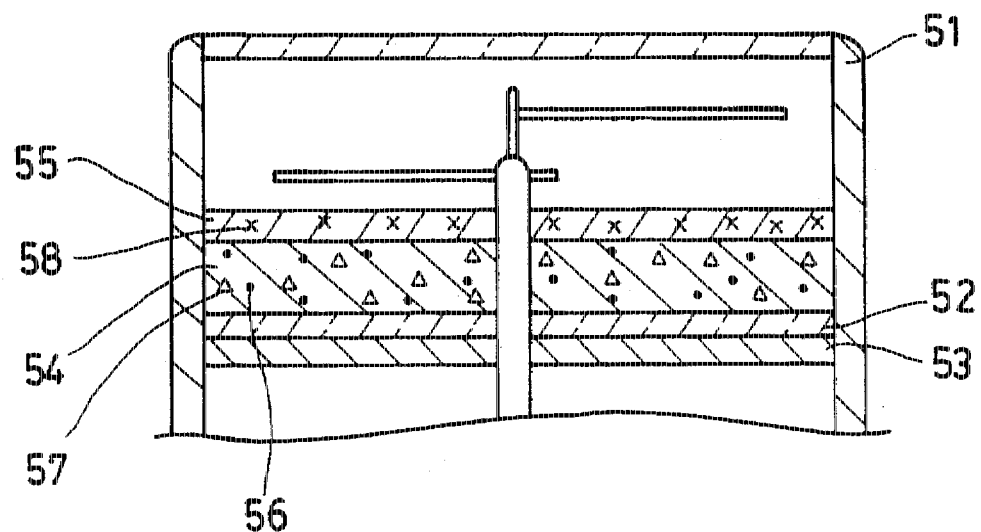
FIG. 11 is a typical sectional view taken on line E—E in FIG. 10 showing the structure of the wristwatch arranged on the front side of the solar battery.

FIG. 10 is a typical front view of a wristwatch provided with a solar battery device of the fifth embodiment according to the present invention having a solar battery divided into four parts and arranged on the inside of a dial plate. FIG. 11 is a typical sectional view taken on line E—E in FIG. 10 showing structure of the wristwatch arranged on the front side of the solar battery.

A glass substrate 52 is fixedly held by the inner surface of a case frame 51. A solar battery 53 is formed on the back surface of the glass substrate 52 by depositing an amorphous silicon film by a plasma CVD process. On the other hand, a diffuse transmission layer 54 and UV light shielding layer 55 are formed on the front side of the glass substrate 52, while the diffuse transmissive layer 54 is also used as a dial face of the solar battery wristwatch.

A transparent epoxy resin was used as a matrix of the diffuse transmissive layer 54, to which 1.0% by weight of titanium dioxide particles having an average particle size of 1 μm was added as a light scattering substance 56. Further, there were added 0.5% by weight of a fluorescent dye (emission center wavelength: 430 nm) of stilbene bisbenzoxazole derivatives which absorbs UV light and emits visible light, and a fluorescent dye (emission center wavelength: 610 nm) of perylene derivatives which absorb visible light having wavelength of 500 nm or less and emit visible light having wavelength over 500 nm as the fluorescent substances, respectively, to the diffuse transmission layer 54. The diffuse transmission layer 54 having such structure was molded to form a sheet 0.4 mm in thickness.

The UV shielding layer 55 was prepared by adding 1.0% by weight of 2,4-dihydroxybenzophenone as a UV light absorbing agent 58 to a transparent epoxy resin as a matrix and molding to form a sheet of 0.25 mm in thickness, which was laminated in front of the diffuse transmission layer 54.

COMPARATIVE EXAMPLE 5

In order to confirm effects obtained by the fifth embodiment, as a comparative example 5, there was used a diffuse transmission layer prepared by adding the same amount of the substances as those used in the fifth embodiment except for laminating the UV shielding layer 55, followed by molding to form the same sized sheet.

The diffuse transmission layer 54 and the UV shielding layer 55 prepared by the fifth embodiment were superposed on the solar battery 53 to evaluate the quantity of light energy which falls on the solar battery 53 with respect to an electromotive force characteristic. Similarly, the diffuse transmission layer was superposed on the solar battery 53 to evaluate the quantity of light energy which falls on the solar battery 53 with respect to the electromotive force characteristic. An electromotive force of 2.50 V or more was regarded as a standard level for acceptance of the electromotive force characteristic under a condition of ordinary indoor illumination (200 Lux-fluorescent lighting) using five series-connected photoelectric cells.

Further, the concealing effect of the solar battery 53 and the weather resistance of the solar battery device were also evaluated. The solar battery device was exposed to a carbon arc having wavelength of 350 nm to 450 nm for 100 hours continuously using a sunshine weather meter and evaluated by means of the gray scale for contamination prescribed by ISO 105-A03. A color chart number 4–5 or more was regarded as a standard level for acceptance.

The results of evaluation are shown in Table 3. As the quantity of light energy which falls on the solar battery 53 varies depending on the fluorescent color emitted by the fluorescent substance 57, the electromotive force characteristic of the solar battery 53 is changed. As a result, enhancement of the electromotive force and the concealment of the solar battery in the fifth embodiment and the comparative example 5 exceeded the standard level for acceptance and showed little difference between these two cases.

As for the UV light shielding characteristic, UV light was transmitted up to nearly 90% in the comparative example 5, while the transmittance was 20% or less in the fifth embodiment. Such difference in the transmittance of UV light resulted in the difference in weather resistant. When the gray scale for contamination was evaluated after 100 hours continuous exposure to the carbon arc of the sunshine weather meter, the color chart number was 2–3 or less in the comparative example 5 in which the UV shielding layer was not arranged, while the color chart number was 4–5 or more in the fifth embodiment. Accordingly, it was confirmed that the solar battery device of the fifth embodiment prevents degradation of the fluorescent substance 57 although UV light is absorbed therein to a certain extent, thereby improving the weather resistance greatly.

TABLE 3

| | Electromotive force of solar battery (V) | Electromotive force characteristic | Appearance concealment of solar battery | UV shielding ratio (%) | Gray scale color chart number | Weather resistance |
|---|---|---|---|---|---|---|
| Fifth Embodiment (white) | 2.52 | ○ | ○ | 80.2 | more than 4-5 | ○ |
| Fifth Embodiment (red) | 2.55 | ○ | ○ | 82.4 | more than 4-5 | ○ |
| Comparative Example 5 (white) | 2.54 | ○ | ○ | 10.0 | less than 2-3 | X |
| Comparative Example 5 (yellow) | 2.53 | ○ | ○ | 12.5 | less than 2 | X |

○ = Acceptable
X = Not Acceptable

Sixth Embodiment

A solar battery device of a sixth embodiment according to the present invention will be described in the following with reference to FIGS. 12 and 13.

Figure 12:
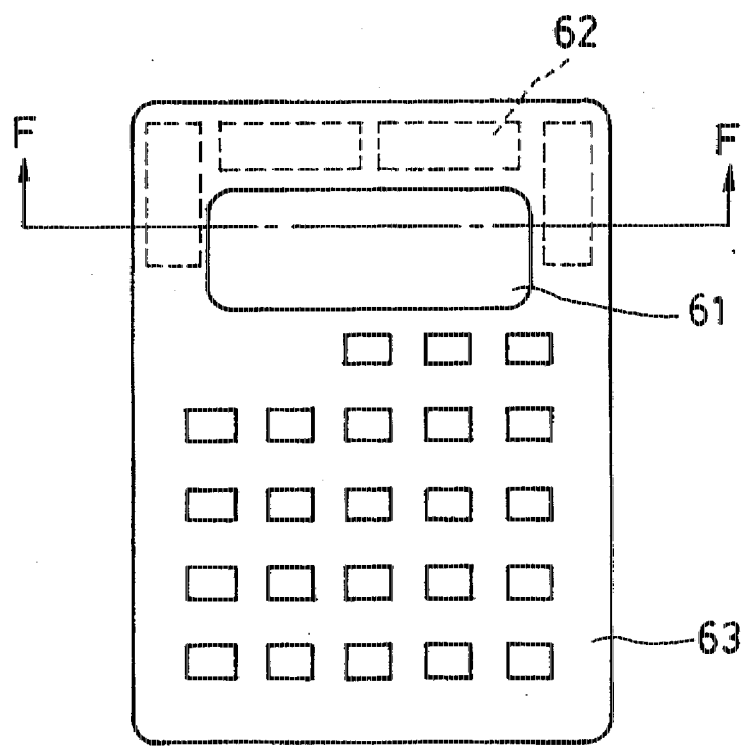
FIG. 12 is a typical front view of an electronic calculator provided with a solar battery device of a sixth embodiment according to the present invention.
Figure 13:
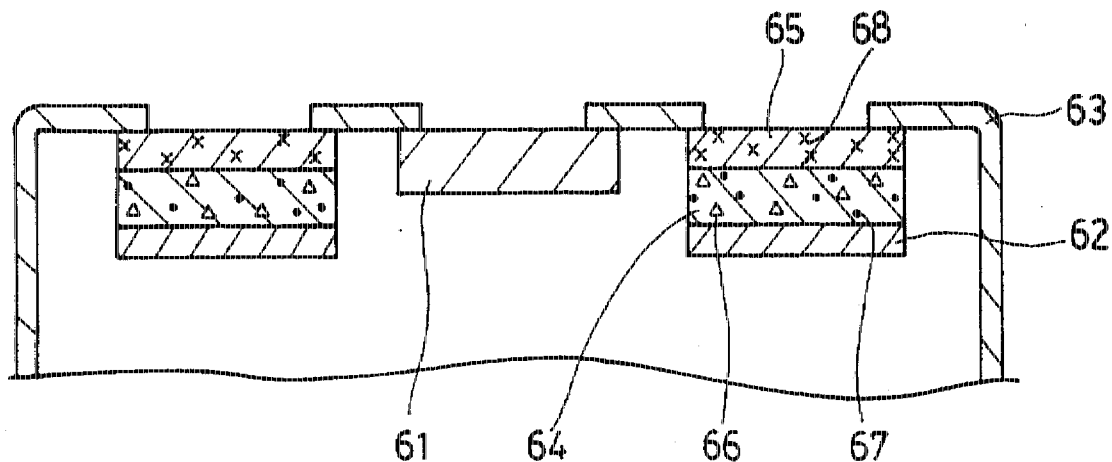
FIG. 13 is a typical sectional view taken on line F—F in FIG. 12 showing the structure of the electronic calculator on the front side of the solar battery.

FIG. 12 is a typical front view of an electronic calculator incorporating the solar battery device in the sixth embodiment according to the present invention, in which the solar battery 62 divided into four parts is arranged so as to surround an outer periphery of a display portion 61. FIG. 13 is a typical sectional view taken on line F—F in FIG. 12 showing the structure of the electronic calculator arranged on the front side of a solar battery.

In the sixth embodiment, the display portion 61 and the solar battery 62 are fixed to an opening of a frame 63 of the electronic calculator from the inside thereof. A diffuse transmissive layer 64 and a UV light shielding layer 65 were laminated on the solar battery 62 to form the solar battery device.

A fluorescent substance 66 and a light scattering substance 67 are added to the diffuse transmissive layer 64. More concretely, a methyl methacrylate resin was used as a matrix of the diffuse transmissive layer 64. A fluorescent dye (emission center wavelength of 435 nm) of 2,5-bis [5'-t-butylbenzoxazolyl (2)] thiophene was use as the fluorescent substance 66 and added in an amount of 0.5% by weight to the diffuse transmissive layer 64. Titanium dioxide particles having an average particle size of 1 μm were used as the light scattering substance 67 and added in an amount of 1.0% by weight to the diffuse transmission layer 64.

An epoxy resin was used as a matrix of the UV shielding layer 65, to which 1.0% by weight of 2-(2'-hydroxy-5'-methylphenyl) benzotriazole as a UV absorber.

When the solar battery device thus constituted was evaluated in the same manner as described in the fifth embodiment, a practically similar result was obtained.

In order to examine an applicable range of the solar battery, the optical transmittance of the diffuse transmission layer 64 was changed by varying the concentration of the light scattering substance. Concentration in the epoxy resin of the titanium dioxide particles having average particle size of 1 μm in the epoxy resin was varied in the range of 0.08% by weight to 12.0% by weight to control the optical transmittance of the diffuse transmissive layer 44.

More concretely, the diffuse transmission layer 64 was superposed on the solar battery 62 to examine the applicable range of the solar battery 62 from standpoints of an electromotive force characteristic and concealing performance thereof by determining the optical transmittance using an illumination meter. An electromotive force of 2.50 V or more was regarded as a standard level for acceptance of the electromotive force characteristic of the solar battery 62 under a fluorescent lighting condition of 200 Lux using five series-connected photoelectric cells.

Results of examination showed that the standard level of 2.50 V or more was obtained when the optical transmittance was over 40% and that the electromotive force characteristic was improved with an increase in the optical transmittance. As to the concealing performance of the solar battery 62, it was unsatisfactory when the optical transmittance exceeded 85%. Accordingly, the optical transmittance of the diffuse transmission layer 64 preferably falls in the range of 40% to 85%.

While the fluorescent substances 57 and 66 are added to the diffuse transmission layers 54 and 66 in the fifth and the sixth embodiments, a phosphorescent substance may be added instead of the substances 57 and 66.

There may be used stilbene bisbenzoxazole derivatives, perylene derivatives and 2,5-bis [5'-t-butyl benzoxazolyl (2)] thiophene, as well as various kinds of luminescent substances which absorb UV light and emit visible light or which absorb visible light having wavelength of 500 nm or less and emit visible light having wavelength over 500 nm as the fluorescent or the phosphorescent substance.

There may be used, for example, 4,4'-diaminostilbene-2, 2'-disulfonate derivatives, coumarin derivatives, oxazole derivatives, naphthalimide compounds, Rhodamine B, Rhodamine G, salicylaldazine, dixanthylene, anthrapyrimidine derivatives, YVO$_4$:Sm, Y$_2$O$_3$:Ho; a ternary complex of rare earth ion, β-diketone and 1,10-phenanthroline; a ternary complex of rare earth ion, β-diketone and trioctylphosphine oxide; and the like as the fluorescent or the phosphorescent substance.

While transparent epoxy and methyl methacrylate resins are used as the matrix of the diffuse transmissive layers 54 and 64 in the fifth and sixth embodiments, other plastic materials such as polycarbonate, polyethylene telephthalate, etc. may be employed.

Further, instead of the titanium dioxide particles white powder of calcium carbonate, magnesium fluoride, etc. may be used, while the powder may have an arbitrary particle size which is not limited to the average particle size of 1 μm.

In addition, while the fluorescent substances 57 and 66 were added to the diffuse transmission layers 54 and 64 in the fifth and the sixth embodiments, a fluorescent layer may be formed independently of the diffuse transmission layers 54 and 64.

Instead of mixing the white powder in the resin, the diffuse transmission layers 54 and 64 may also be prepared by a construction in which a surface of transparent glass or a resin is subjected to a honing treatment, or processed to form a fisheye-, lenticular- or Fresnel-lens shape or to form a fine prism-like layer on the surface. The diffuse transmission layers 54 and 64 may be prepared by modifying a surface of plastics or formed from a resin having diffuse transmitting properties due to the molecular structure thereof, such as Teflon or polyacetal.

While the epoxy resin is used as the UV light shielding layers 55 and 65 as well as 2,4-dihydroxybenzophenone and 2-(2'-hydroxy-5'-methylphenyl) benzotriazole are used as the UV light absorber in the fifth and sixth embodiments, transparent plastic materials such as methyl methacrylate, polystyrene, polycarbonate, polyethylene telephthalate, etc. may also be used.

The UV light shielding layer may be directly formed on a layer which contains the fluorescent or phosphorescent substance by a spin coating or dipping process.

There may be used UV light absorbers such as, for example, 2-hydroxy-4-methoxybenzophenone, 2-hydroxy-4-methoxybenzophenone, 2-hydroxy-4-octyloxybenzophenone, 2-hydroxy-4-dodecyloxybenzophenone, 2,2'-dihydroxy-4-methoxybenzophenone, 2,2'-dihydroxy-4,4'-dimethoxybenzo-phenone, 2-hydroxy-4-methoxy-5-sulfobenzophenone, 2-(2'-hydroxy-5'-t-butylphenyl) benzotriazole, 2-(2'-hydroxy-3,5'di-t-butylphenyl)-benzotriazole, 2-(2'-hydroxy-3'-t-butyl-5'-methylphenyl)-5-chloro-benzotriazole, 2-(2'-hydroxy-3,5'di-t-butylphenyl)-5-chloro-benzotrazole, 2-(2'-hydroxy-3',5'-di-t-amylphenyl) benzotriazole, 2-{2'-hydroxy-3'-(3",4",5",6"-tetrahydro-phthalimidemethyl) -5'-methylphenyl} benzotriazole, phenyl salicylate, p-t-butylphenyl salicylate, p-octylphenyl salicylate and the like.

For the purpose of further improving the weather resistance of the layer which contains the fluorescent or the phosphorescent substance of the fifth and sixth embodiments, there may be added a small amount of the hindered amine light stabilizer having a structure in which all hydrogen atoms bonded to the 2- and 6-position carbon atoms of piperidine are substituted by methyl groups, such as bis (2,2,6,6-tetramethyl-4-piperidyl) sebacate.

As the concentration quenching would occur similarly as described in the first to the fourth embodiment when the added amount of the fluorescent substances 57 and 66 is increased, the added amount thereof should be controlled by considering the concentration limit of the concentration quenching. The concentration quenching did not occur with the concentrations used in the fifth and sixth embodiments.

Seventh Embodiment

A solar battery device of a seventh embodiment according to the present invention will be described in the following with reference with FIGS. 14 to 16.

Figure 14:
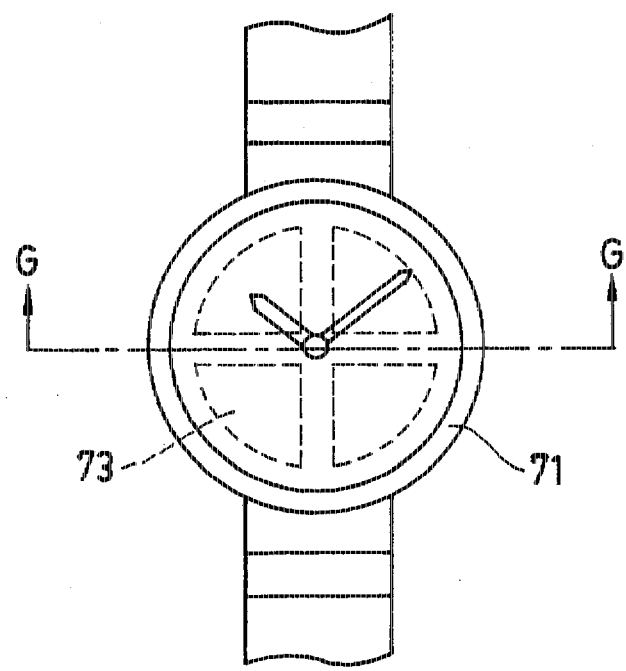
FIG. 14 is a typical front view of a wristwatch provided with a solar battery device of a seventh embodiment according to the present invention.
Figure 15:
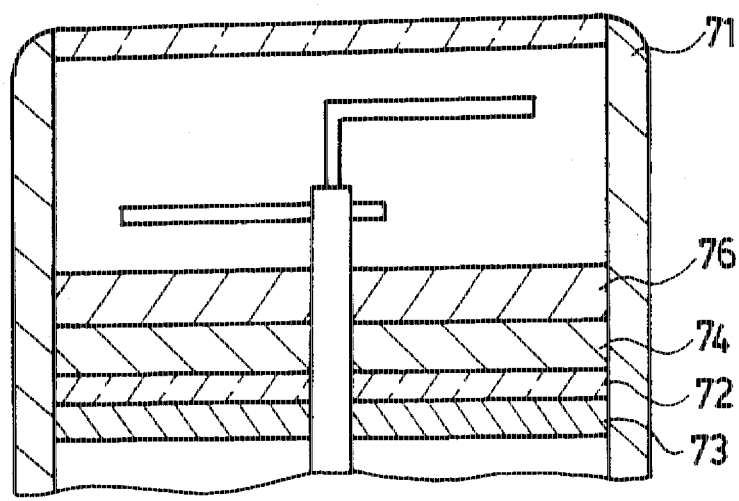
FIG. 15 is a typical sectional view taken on line G—G in FIG. 14 showing structure of the wristwatch arranges on the front side of the solar battery.

FIG. 14 is a typical front view of a wristwatch provided with a solar battery device of the seventh embodiment according to the present invention having a solar battery divided into four parts and arranged on the inside of a dial plate. FIG. 15 is a typical sectional view taken on line G—G in FIG. 14 showing structure of the wristwatch arranged on the front side of the solar battery.

A glass substrate 72 is fixedly held by the inner surface of a case frame 71. A solar battery 73 is formed on the back surface of the glass substrate 72 by forming an amorphous silicon film by a plasma CVD process.

Figure 16:
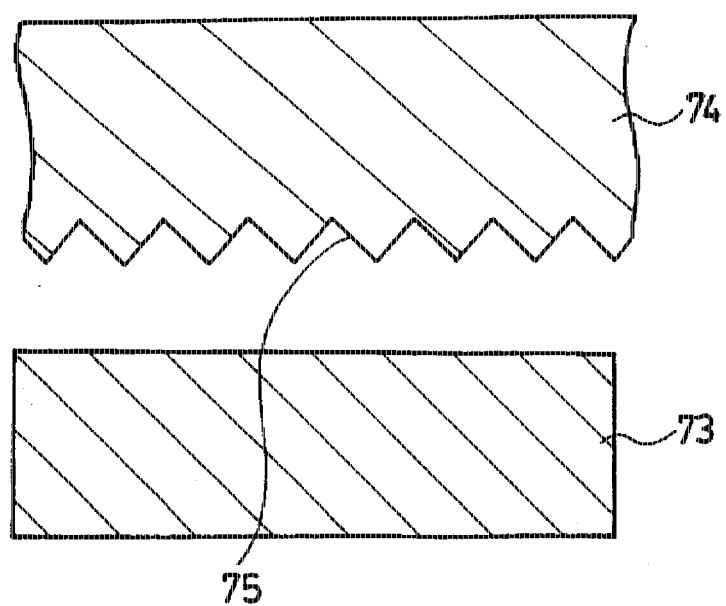
FIG. 16 is a typical sectional view of the constitution of a solar battery device used in the seventh embodiment according to the present invention.

A shielding layer 74 is laminated in front of the glass substrate 72 as enlargedly shown in FIG. 16. A light shielding surface 75 for scattering light is formed on one surface of the shielding layer 74. The shielding layer 74 is laminated on the glass substrate 72 so that the light shielding surface 75 is directed to a side opposed to the solar battery. According to the seventh embodiment, one surface of transparent plate glass used as the shielding layer 74 is machined to form a continuous prismatic structure of the light shielding surface 75 in which a number of quadrangular pyramid units each having base lengths of 50 μm extend both in length and width directions (X-Y directions).

Further, a diffuse transmission layer 76 is laminated in front of the shielding layer 74. A ceramic material prepared by sintering titanium dioxide powder was used as the diffuse transmission layer 76 in the seventh embodiment. The optical transmittance of the diffuse transmission layer 76 was about 55% irrespective of the direction of incident light. The diffuse transmission layer 76 is structured to also serve as a dial face of the solar battery wristwatch.

In order to examine the optical transmissive anisotropy of the shielding layer 74, the vertical angle of the quadrangular pyramids formed on the light shielding surface 75 was varied in the range of 70° to 120° to determine the optical transmittance of the shielding layer 74 under a condition of lighting of weak vertical directionality.

Figure 17:
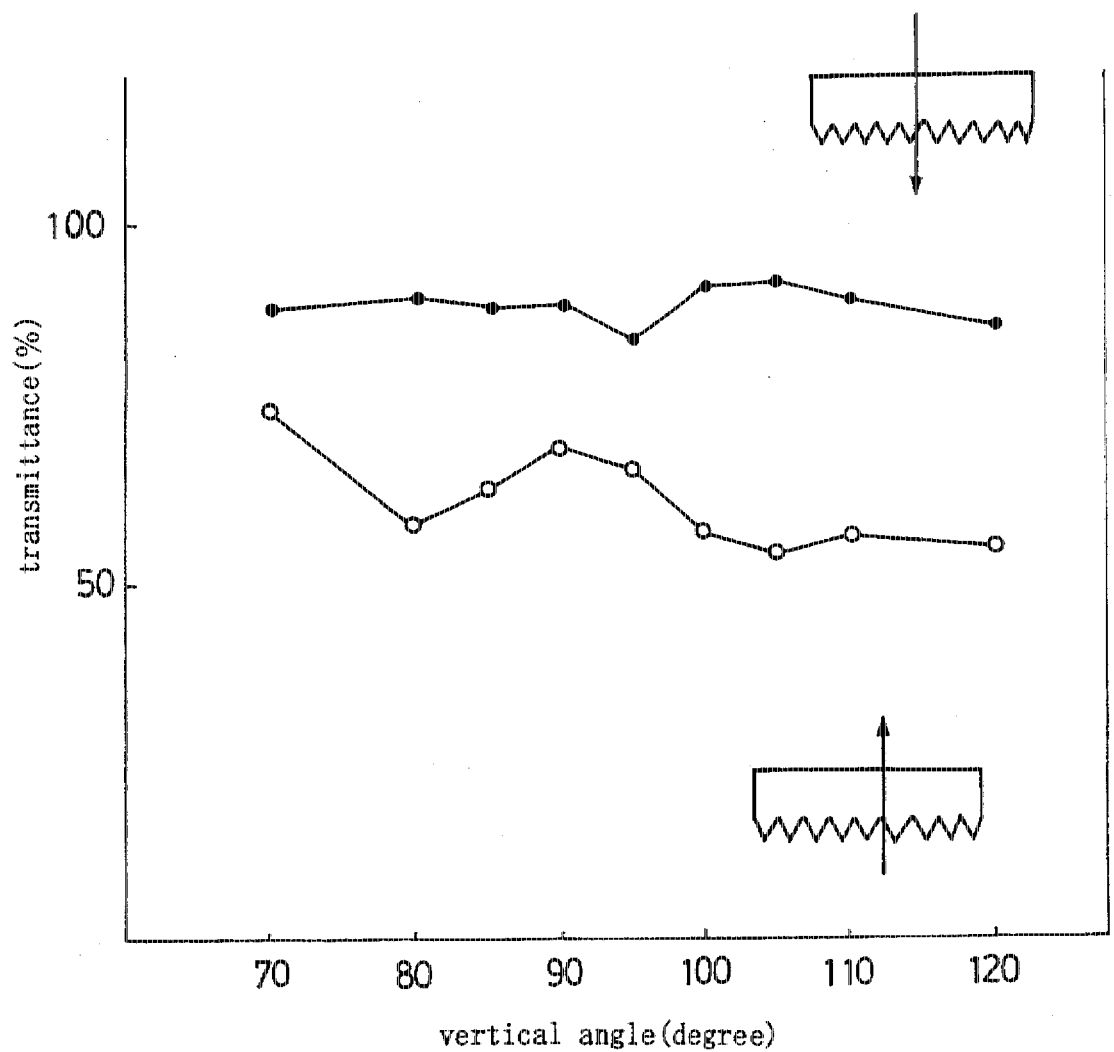
FIG. 17 is a graph showing the relationship between prism angles and transmittance of a shielding layer used in the seventh embodiment.

Results of examination are shown in FIG. 17. Dots used in the graph show the relationship between the vertical angle and the optical transmittance of light entering from the front side (side of the diffuse transmission layer 76) of the shielding layer 74, while circles show the relationship between the vertical angle and the transmittance of light entering reversely from the back surface side (side of the solar battery 73) to the shielding layer 74.

It is clear from FIG. 17 that more than 92% of the light entering from the front side was transmitted, but the quantity of light transmitted from the back surface side decreases to 55% or less when the vertical angle of the quadrangular pyramid formed on the light shielding surface 75 is 105° toward the vertical incident light. That is, when the light shielding surface 75 faces the solar battery 73, with respect to light of weak directionality, more than 92% of the incident light entering the shielding layer 74 reaches the solar battery 73, thereby contributing to power generation thereof. While reflectivity of the solar battery 73 is at most about 70%, the quantity of light which is reflected by the solar battery 73 and transmitted through the shielding layer 74 and returned to the front side decreases to 35% or so.

The directionality of emitted light to incident light of the diffuse transmission layer 76 is considerably dependent on the materials and the method for preparing the same. While the diffuse transmission layer 76 used in the seventh embodiment had high optical diffusivity, the light which was transmitted through the layer 76 to enter the shielding layer 74 showed weak vertical directionality. Accordingly, it was confirmed that the shielding layer 74 on which the light of weak vertical directionality enters from the diffuse transmission layer 76 showed transmissive anisotropy in the solar battery device of the seventh embodiment.

COMPARATIVE EXAMPLE 7-1

To confirm effects of the seventh embodiment, a solar battery device of a structure in which only the diffuse transmission layer 76 is arranged on the front side of the solar battery 73 without incorporating the shielding layer 74 was prepared as a comparative example 7-1. The diffuse transmission layer 76 used herein was made of the same material and the same size as described in the seventh embodiment, the optical transmittance of which was 50%, independent of the incident direction of light.

COMPARATIVE EXAMPLE 7-2

To further confirm effects of the seventh embodiment, a solar battery device of a structure in which only the diffuse transmission layer 76 is arranged on the front side of the solar battery 73 without incorporating the shielding layer 74 was prepared as a comparative example 7-2. The diffuse transmission layer 76 used herein was made of the same material and the same size as described in the seventh embodiment, the optical transmittance of which was 39%, independent of the incident direction of light.

An electromotive force characteristic of each solar battery device prepared according to the seventh embodiment and the comparative examples 7-1 and 7-2 was evaluated, while a shielding effect of light reflected by the solar battery was also evaluated.

An electromotive force of 2.50 V or more was regarded as a standard level for acceptance of the electromotive force characteristic under a condition of ordinary indoor illumination (200 Lux-fluorescent lighting) using five series-connected photoelectric cells. On the other hand, the shielding performance was evaluated with respect to what extent the solar battery 73 can be visually identified from the outside by a viewer.

In the solar battery device of the seventh embodiment, the electromotive force of the solar battery 73 was more than 2.52 V, which exceeded the standard level for acceptance concerning the electromotive force characteristic. Because the optical transmittance of the diffuse transmission layer 76 was 55% and that of the shielding layer 74 to the incident light from the diffuse transmission layer 76 side was 92%, about 50% of the incident light from outside reached the solar battery 73, which contributed to power generation.

As to the shielding performance of the solar battery device according to the seventh embodiment, it was difficult to identify the solar battery 73 portion consisting of amorphous silicon and a metal electrode portion from the outside. That is, the solar battery 73 could be almost completely concealed.

On the other hand, while the optical transmittance of the diffuse transmission layer 76 is 50% in the solar battery device of the comparative example 7-1, about 50% of incident light from outside reached the solar battery to contribute to power generation. As a result, the electromotive force characteristic exceeded the standard level for acceptance of 2.50 V or more.

As to the shielding performance, however, both the solar battery 73 portion and the metal electrode portion were clearly visible from outside, thereby yielding an unsatisfactory result.

In the solar battery device of the comparative example 7-2, while the optical transmittance of the diffuse transmission layer 76 is 39%, only a small quantity of incident light falls on the solar battery 73. As a result, the electromotive force of the solar battery was 2.48 V, which did not satisfy the standard level for acceptance.

As to the shielding performance, it was difficult to visually identify both of solar battery 73 portion and the metal electrode portion from outside, thereby yielding a satisfactory result.

The results are shown in Table 4.

TABLE 4

| | Quantity of light falling on the solar battery surface with respect to initial incident light (%) | Electromotive force of the solar battery (V) | Evaluation of electromotive characteristic | Evaluation of shielding performance |
| --- | --- | --- | --- | --- |
| Seventh Embodiment | 50 | 2.52 | ○ | ○ |
| Comparative Example 7-1 | 50 | 2.52 | ○ | X |
| Comparative Example 7-2 | 39 | 2.48 | X | ○ |

○ acceptable
X = Not Acceptable

Eighth Embodiment

Figure 18:
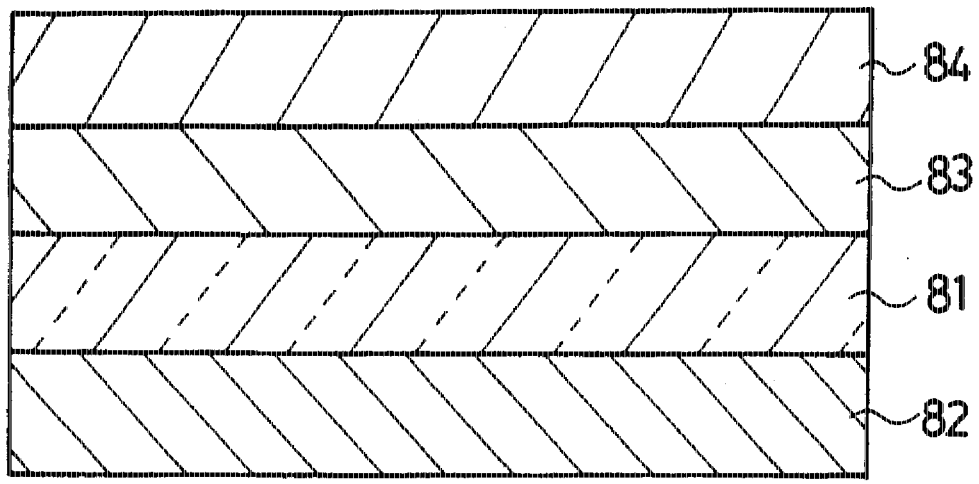
FIG. 18 is a typical sectional view of the constitution of a solar battery device used in an eighth embodiment according to the present invention.

A solar battery device of an eighth embodiment according to the present invention will be described in the following, with reference with FIGS. 18 to 20.

Similarly as described in the seventh embodiment, a solar battery of an eighth embodiment also has a constitution in which a solar battery 82 is formed on the back surface of a glass substrate 81, while a shielding layer 83 is laminated on the front surface of the glass substrate 81. Further, a diffuse transmission layer 84 is laminated in the front surface of the shielding layer 83.

Figure 19:
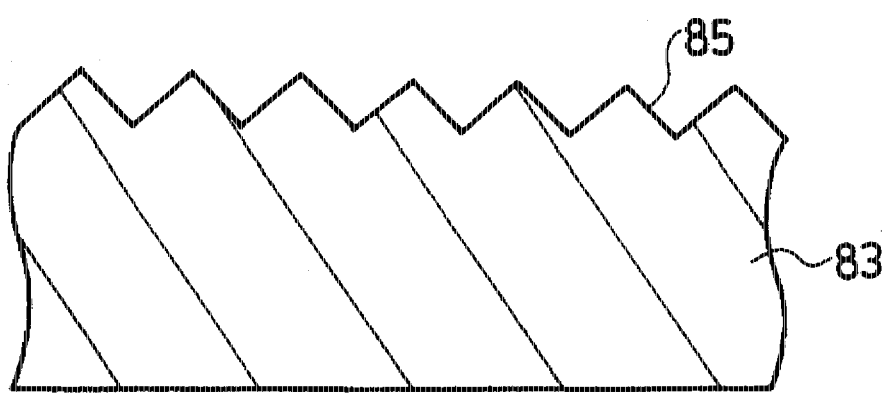
FIG. 19 is a typical sectional view showing the structure of a shielding layer used in the eighth embodiment.

It is different from the seventh embodiment in that a light shielding surface 85 formed on one surface of the shielding layer 83 as shown in FIG. 19 faces of the diffuse transmission layer 84 in the eighth embodiment.

In order to examine optical transmissive anisotropy of the shielding layer 83 of the solar battery device according to the eighth embodiment, the vertical angle of the quadrangular pyramids formed on the light shielding surface 85 was varied in the range of 70° to 120° to determine the optical transmittance of thereof under a condition of lighting of strong vertical directionality.

Figure 20:
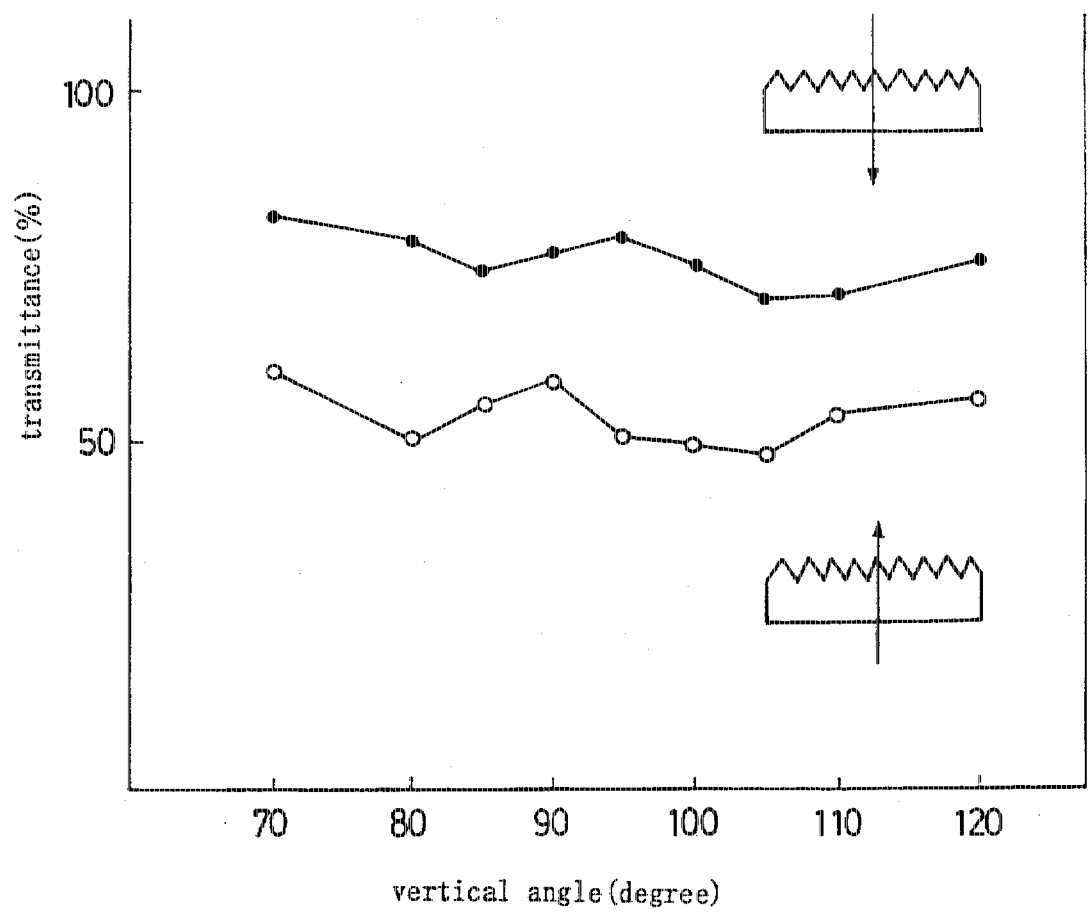
FIG. 20 is a graph showing the relationship between prism angles and transmittance of a shielding layer used in the eighth embodiment.

The results of examination are shown in FIG. 20. Dots used in the graph shows the relationship between the vertical angle and the optical transmittance of light entering from the side of the diffuse transmission layer 84 to the shielding layer 83, while circles show the relationship between the vertical angle and the transmittance of light entering reversely from the side of the solar battery 82 to the shielding layer 83.

It is clear from FIG. 20 that more than 78% of the light entering from the side of the diffuse transmission layer 84 was transmitted when the vertical angle of the quadrangular pyramids formed on the light shielding surface 85 is 80° or 95° toward the vertical incident light. However, the quantity of light entering from the side of the solar battery 82 and transmitted through the shielding layer 83 decreases to 50% or less.

Thus, according to the eighth embodiment, more than 78% of the quantity of light falling on the shielding layer 83 from the side of the diffuse transmission layer 84 reaches the solar battery 82 when incident light of directionality enters, which contributes to power generation. While reflectivity of the solar battery 82 is at most about 70%, the quantity of light which is reflected by the solar battery 82 and transmitted through the shielding layer 83 and returned to the front side decreases to 27% or so.

Accordingly, when a diffuse transmission layer 84 of weak optical diffusivity is used, incident light which is transmitted through the diffuse transmission layer 84 to enter the shielding layer 83 has rather strong directionality, and for that reason, preferably the constitution of the eighth embodiment is such that the shielding layer 83 has transmissive anisotropy to intensely directional light.

The optical transmittance of the diffuse transmission layer 84 used in the eighth embodiment was about 71%. While the transmittance of the shielding layer 83 to incident light from the side of the diffuse transmission layer 84 was 78%, about 55% of incident light from outside reached the solar battery 82, which contributed to power generation.

It was difficult in the solar battery device of the eighth embodiment to visually identify both the solar battery 82 portion consisting of amorphous silicon and the metal electrode portion from the outside. That is, the solar battery 82 was almost completely shielded.

As a comparative example, there was prepared a solar battery device having a construction in which a shielding layer having an optical transmittance of about 78% and no transmissive anisotropy is arranged between the solar battery 82 and the diffuse transmission layer 84.

In the solar battery device of the comparative example, a considerable quantity of light was transmitted through the shielding layer and the diffuse transmission layer and emitted outside after the light was reflected by the metal electrode portion of the solar battery 82, thereby allowing the solar battery 82 to be clearly identified from the outside by a viewer's eyes. Thus, the shielding effect was insufficient.

Although it could be possible to secure the shielding effect by reducing the transmittance of a shielding layer per se which has no transmissive anisotropy, the quantity of light reaching the solar battery would be reduced so as to lower the electromotive force characteristic. Further, the intensity of reflected light is reduced, thereby displaying only a cloudy appearance and thus lowering the quality of appearance.

Ninth Embodiment

Figure 21:
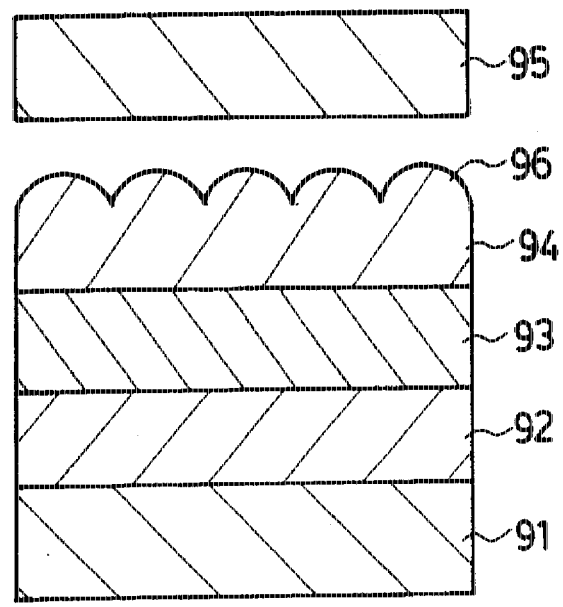
FIG. 21 is a typical sectional view of the constitution of a solar battery device used in a ninth embodiment according to the present invention.

A solar battery device of a ninth embodiment according to the present invention will be described in the following with reference to FIG. 21.

A solar battery 93 was formed above a metal substrate 91 through an insulating layer 92 in the ninth embodiment, while a shielding layer 94 was formed on the front side of the solar battery 93 and, in addition, a diffuse transmission layer 95 was laminated on the front side of the shielding layer 94.

More concretely, the solar battery 93 was formed above metal substrate 91 such as stainless steel through the insulating layer 92 such as polyimide. The shielding layer 94 provided with a hemispherical light shielding surface 96 was directly formed in front of the solar battery 93. A diffuse transmission layer 95 having weak optical diffusivity and a transmittance of 68% was used in the ninth embodiment.

A method for preparing the shielding layer 94 will be described. First of all, a mother die for forming the shielding layer 94 was prepared in the ninth embodiment by the following procedure.

A gold film was formed on a silicon wafer of (100)crystal plane, followed by subjecting it to a photolithographic process and an etching process to remove round portions of the gold film having a diameter of 5 μm and a pitch of 30 μm. The silicon wafer was subsequently immersed in a mixture of concentrated hydrofluoric acid, nitric acid, and acetic acid to etch the silicon wafer onmidirectionally starting from each portion where the gold film was removed. Then, the mother die having regularly arranged hemispherical recesses thereon was obtained by removing the residue of the gold film.

The diameter of the recesses depends on the time period of the etching. After 30 minutes of etching, there was obtained mother die in which hemispheres of about 25 μm were continuously arranged in order in the X-Y directions. Using the thus prepared mother die, an electroformed mold was prepared to form the shielding layer 94 by casting a PMMA (Poly Methyl Methacrylate) resin on the solar battery 93 and transferring hemispherical shapes on a surface thereof by means of the electroformed mold. The thus transferred portion serves as the light shielding surface 96 comprising an aggregation of hemispherical convexities, while the diffuse transmission layer 95 and the shielding layer 94 are integrally molded.

The shielding layer 94 was prepared on a transparent glass plate in a similar manner to examine the transmissive anisotropy. As a result, the transmittance of incident light entering the shielding layer 94 from the front side opposite to the diffuse transmission layer 95 was about 92%. On the other hand, the transmittance of incident light entering the shielding layer 94 from the back side opposite to the solar battery 93 was 65%. Thus, the transmissive anisotropy of the shielding layer 94 was also confirmed in the present constitution.

Accordingly, it is possible to conceal the solar battery 93 in the constitution of the ninth embodiment so as not to be identified from outside by simply controlling the optical transmittance of the diffuse transmission layer 95 by reducing it several percent or so.

In the ninth embodiment, the above mentioned shielding layer 94 having the transmissive anisotropy was formed in a thickness of only about 60 μm directly on the solar battery 93 by employing transfer technology of plastics, thereby simplifying the constitution and also reducing the thickness of the device as a whole. Further, the shielding layer 94 on the solar battery 93 also functions as a protective layer which improves durability of the solar battery 93.

In addition, while the solar battery 93 and the shielding layer 94 are integrally molded, only the diffuse transmission layer 95 is arranged in a subsequent built-up process, which contributes to simplifying such a process.

Although the light shielding surface 96 of the shielding layer 94 consists of an aggregation of the hemispherical convexities in the ninth embodiment, the light shielding surface 96 is not limited to such a form but may be shaped to various kinds of light diffusive forms consisting of an aggregation of convexities such as quadrangular pyramid shaped prisms, lenses, and truncated prisms or lenses, or an intermittent arrangement of such convexities with gaps left between bases thereof.

Further, while the hemispherical convexities are formed arranged in the X-Y directions on the light shielding surface 96 of the shielding layer 94 in the ninth embodiment, these convexities may be arranged in the circumferential direction (θ-direction), followed by arrangement of each array of the convexities thus formed in the radial direction (r direction). Further, positions of the convexities in each array may be shifted by half a pitch between each line.

When recesses are arranged at random on a transferring surface of the electroformed mold to form convexities also at random on the light shielding surface 96 of the shielding layer 94, it is more difficult to identify linear parts on the solar battery 93 from outside.

Tenth Embodiment

Figure 22:
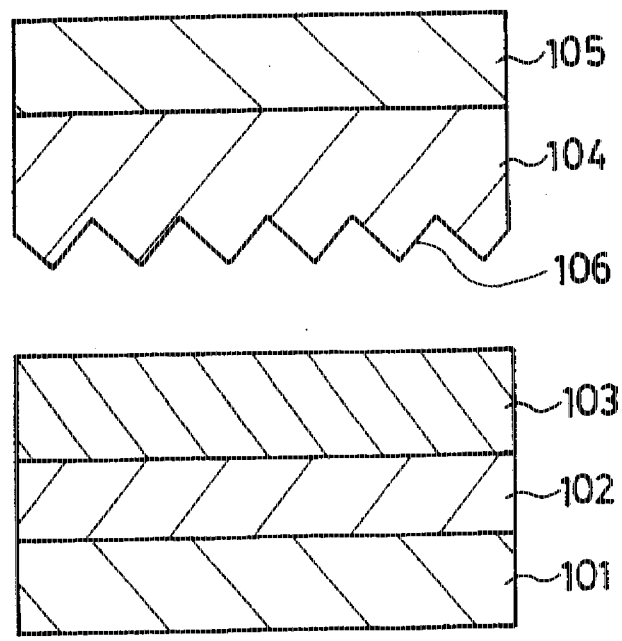
FIG. 22 is a typical sectional view of the constitution of a solar battery device used in a tenth embodiment according to the present invention.

A solar battery device of a tenth embodiment according to the present invention will be described in the following with reference to FIG. 22.

A solar battery device of the tenth embodiment has a constitution in which a solar battery 103 is formed above a metal substrate 101 through an insulating layer 102, while a shielding layer 104 and a diffuse transmission layer 105 are laminated successively on the front side of the solar battery 103. The diffuse transmission layer 105 having intense optical diffusivity and a transmittance of 58% was used in the ninth embodiment.

More concretely, the solar battery 103 was formed above a metal substrate 101 such as brass steel through an insulating layer 102 such as polyimide. A shielding layer 104 is integrally molded to the back surface side of the diffuse transmission layer 105 as shown in FIG. 22. A light shielding surface 106 of the shielding layer 104 was formed into a prism shape on the back surface, facing the solar battery 103.

A method for preparing the shielding layer 104 will now be described. First of all, a metal die for forming the shielding layer 104 was prepared by the following procedure.

Using an automatic lathe provided with a hard metal bit having a point vertical point angle of 85°, one surface of a brass steel substrate 10 mm in thickness was subjected to a parallel scoring process with a scoring depth of 23 µm and a feeding pitch of 50 µm. The same scoring process was repeated on the same surface crosswise to the scored direction as mentioned above. The brass steel substrate thus scored was degreased and washed to prepare a metal die for forming the shielding layer.

After the metal die was prepared as described above, PMMA resin was cast on the diffuse transmission layer 105, while the thus processed portion was transferred on the resin surface by the metal die for forming the shielding layer. The transferred portion resulted in the light shielding surface 106 comprising an aggregation of convexities of quadrangular pyramid shaped prisms, whereby the diffuse transmission layer 105 and the shielding layer 104 were integrally molded.

The diffuse transmission layer 105 and the shielding layer 104 thus integrally molded were arranged on the solar battery 103 to form the solar battery device. The light shielding surface 106 of the shielding layer 104 was positioned facing to the front side of the solar battery 103.

The shielding layer 104 was prepared on a transparent glass plate in a similar manner to examine the transmissive anisotropy. As a result, the transmittance of incident light entering the shielding layer 104 from the front side contacting the diffuse transmission layer 105 was about 90%. On the other hand, the transmittance of incident light entering the shielding layer 104 from the back side facing to the solar battery 103 was 58%. Namely, the transmissive anisotropy of the shielding layer 104 was also confirmed in the present constitution.

Accordingly, it is possible to conceal the solar battery 103 in the constitution of the tenth embodiment so as not to be identified from outside by simply controlling the optical transmittance of the diffuse transmission layer 105 to reduce it several percent or so.

In the tenth embodiment, the above mentioned shielding layer 104 having the transmissive anisotropy was integrally molded in a thickness of about 60 µm on the diffuse transmission layer 105 by employing transfer technology of plastics, thereby simplifying the constitution and also reducing the thickness of the device as a whole.

Although the light shielding surface 106 of the shielding layer 104 consists of an aggregation of the prism shaped convexes in the tenth embodiment, the light shielding surface 106 is not limited to such a form but may be shaped to various kinds of light diffusive forms consisting of an aggregation of convexities such as lenses and truncated prisms or lenses, or an intermittent arrangement of such convexities with gaps left between bases thereof.

Further, while the prism shaped convexities are formed in the X-Y directions on the light shielding surface 106 of the shielding layer 94 in the ninth embodiment, these convexities may arranged in the circumferential direction (θ-direction), followed by arrangement of each array of the convexities thus formed in the radial direction (r-direction). Further, positions of the convexities in each array may be shifted by half a pitch between each line.

When the shielding layer having the transmissive anisotropy as described in the seventh to the tenth embodiments of the present invention is used, a large quantity of incident light entering from outside can be introduced to the solar battery to sufficiently generate an electromotive force, while the effect of concealing appearance of the solar battery from outside can be considerably improved by shielding reflected light from the solar battery.

As has been described above, one surface of transparent plate glass as the shielding layer 74 is machined to form a structure of a continuous prismatic surface in which a number of quadrangular pyramidal units each having a vertical angle of 105° and a base length of 50 µm extend in the X-Y directions in the seventh embodiment. While in the eighth embodiment, one surface of a transparent plate glass as the shielding layer 83 is machined to form a structure of a continuous prismatic surfaces in which a number of quadrangular pyramid units each having a vertical angle of 80° or 95° and a base length of 50 µm extend in the X-Y directions.

However, the vertical angle of the quadrangular pyramids which form a prism is not limited to the above mentioned angle but may be set arbitrarily in a machinable range. Further, other than a structure of a continuous prismatic surface, a transparent resin or a glass plate may be subjected to a honing treatment, processed to form to a fisheye-, lenticular- or Fresnel-lens shape, or be formed in any arbitrary light diffusive form consisting of an aggregation of convexities or recesses such as quadrangular pyramid shaped prisms, lenses, and truncated prisms or lenses, or an intermittent arrangement of such convexities or recesses with gaps left between bases thereof.

Further, although a glass plate is used as the material for the shielding layer in the seventh and the eighth embodiments, a transparent resin may also be employed as described in the ninth and the tenth embodiments.

Furthermore, in the seventh and the eighth embodiments, it is possible to form the shielding layers 74 and 83 consisting of a plastic material directly in front of the solar batteries 73 and 82 by means of an electroforming process similarly as described in the ninth embodiment. On the other hand, using a metal die casting process, the shielding layer 74 and 83 consisting of a plastic material may be formed directly on the diffuse transmission layers 76 and 83 similarly as described in the tenth embodiment. It is also possible to form the shielding layers 74 and 83 by an injection molding process, etc.

The diffuse transmission layer used in the seventh to the tenth embodiments of the present invention may be formed from ceramic prepared by sintering titanium dioxide. The diffuse transmission layer may also be formed from ceramics prepared by sintering zirconium oxide, magnesium oxide, yttrium oxide, aluminum oxide and the like instead of titanium dioxide, or possibly from paper, fiber and the like if such materials allow light to be diffusively transmitted.

The diffuse transmission layer used in these embodiment may also formed by adding particles of titanium dioxide, calcium carbonate, magnesium fluoride or the like as a light scattering substance to a transparent plastic material such as a transparent epoxy resin, methyl methcrylate resin, polystyrene, polyethylene, polycarbonate, polyethylene telephthalate and the like.

In addition, either one or both of a fluorescent substance and a phosphorescent substance may be added to the diffuse transmission layer used in these embodiments. A hindered amine light stabilizer can be further added to the layer together with the above mentioned substances. A similar effect can be obtained as the diffuse transmission layer which contains such fluorescent and phosphorescent substances as well as hindered amine light stabilizer, when these additives are added as described above.

Further, a coloring agent may be added to the diffuse transmission layer used in the present embodiments to display any arbitrary color. A number of dyes and pigments including a fluorescent dye or a fluorescent pigment can be used as the coloring agent.

As has been described in the above mentioned embodiments, there may be used various kinds of fluorescent materials which absorb light of shorter wavelength and change it to light of a longer wavelength, thereby emitting light, as the fluorescent substance. The following materials may be used as the florescent substance such as, for example, 2,5-bis [5'-t-butylbenz-oxazolyl (2)] thiophene, perylene, perylene derivatives, stilbene derivatives, coumarin derivatives, oxazole derivatives, stilbene-bisbenzoxazole derivatives, naphthalimide compounds, Rhodamine B, Rhodamine G, salicylaldazine, dixanthylene, anthrapyrimidine derivatives, anthraquinone derivatives, $YVO_4$:Sm, $Y_2O_3$:Ho; a ternary complex of rare earth ion, β-diketone and 1,10-phenanthroline; a ternary complex of rare earth ion, β-diketone and trioctylphosphine-oxide; and the like.

As the hindered amine light stabilizer, there may be used any compound having structure in which all hydrogen atoms bonded to the 2-and 6-position carbon atoms of piperidine are substituted by methyl groups, such as bis (2,2,6,6-tetramethyl-4-piperidyl) sebacate, bis (1,2,2,6,6-pentamethyl-4-piperidyl) sebacate, 1-[2-{3-(3,5-di-t-butyl-4-hydroxyphenyl) propionyloxy}-ethyl]-4-[3-(3,5-di-t-butyl-4-hydroxyphenyl) propionyloxy]-2,2,6,6-tetramethylpiperidine, 4-benzoyloxy-2,2,6,6-tetramethyl-piperidine, 8-acetyl-3-dodecyl-7,7,9,9-tetramethyl- 1,3,8-triazaspiro [4.5]-decane-2,4-dione, dimethyl succinate 1-(2-hydroxy-ethyl)-4-hydroxy-2,2,6,6-tetramethylpiperidine, poly [{6-(1,1,3,3-tetramethylbutyl) amino-1,3,5-triazine-2, 4-diyl} {2,2,6,6-tetra-methyl-4-piperidyl) imino} hexamethylene {2,2,6,6-tetramethyl-4-piperidyl) -imino}], N,N'-bis (3-aminopropyl) ethyleneamine 2,4-bis [N-butyl-N-(1,2, 2,6,6-pentamethyl-4-piperidyl) amino] -6-chloro-1,3,5-triazine, 2-(3,5-di-t-butyl-4-hydroxybenzyl)-2-n-butyl-malonate bis (1,2,2,6,6-pentamethyl-4-piperidyl), 1,2,2,6,6-pentamethyl-4-piperidyl/tridecyl 1,2,3,4-butanetetracarboxylate and the like.

Any number of the solar batteries and any arbitrary electrical connecting structure may be used in the first to the tenth embodiments of the present invention.

INDUSTRIAL APPLICABILITY

The present invention is applicable to various products using solar batteries, such as watches, electronic calculators and radios.

The present invention ensures the supply of sufficient light energy to the solar battery, conceals the solar battery from view, and improves the quality of appearance.

What is claimed is:

1. A solar battery device comprising:
   a diffuse transmission layer diffusing incident light on the front side of a solar battery; and
   an opaque luminescent layer absorbing a predetermined wavelength band of the incident light and emitting light,
   said diffuse transmission layer and said opaque luminescent layer being successively arranged on the front side of said solar battery, and
   40 to 85% of the incident light reaches said solar battery.

2. A solar battery device according to claim 1, wherein said diffuse trammission layer includes:
   a luminescent substance having at least one of a fluorescent material and a phosphorescent material; and a hindered amine light stabilizer.

3. A solar battery device according to claim 1, wherein said opaque luminescent layer includes a luminescent substance which absorbs UV and emits visible light.

4. A solar battery device comprising:
   a diffuse transmission layer diffusing light incident on the front side of a solar battery; and
   a shielding layer diffusing and reducing a quantity of light reflected by said solar battery,
   said shielding layer and said diffuse transmission layer being laminated successively on the front side of said solar battery, and
   said shielding layer having an anisotropic light transmitting characteristic with different light transmittances in different directions to transmit a quantity of the incident light reaching said solar battery greater than the quantity of light reflected from said solar battery.

5. A solar battery device according to claim 4, wherein said shielding layer is integrally formed on the front side of said solar battery.

6. A solar battery device according to claim 4, wherein said shielding layer is integrally formed on a back side of said diffuse transmission layer.

7. A solar battery device according to claim 4, wherein said shielding layer is a colorless transparent plate material having a three dimensionally shaped surface.

8. A solar battery device comprising:
   a diffuse transmission layer diffusing incident light on the front side of a solar battery; and
   a shielding layer diffusing and reducing a quantity of light reflected by said solar battery,
   said shielding layer and said diffuse transmission layer being laminated successively on the front side of said solar battery,
   said diffuse transmission layer including a luminescent substance for absorbing a predetermined wavelength band of the incident light and for emitting light, and
   said shielding layer having an anisotropic light transmitting characteristic with different light transmittances in different directions to transmit a quantity of the incident light reaching said solar battery greater than the quantity of light reflected from said solar battery.

9. A solar battery device according to claim 8, wherein said shielding layer is integrally formed on the front side of said solar battery.

10. A solar battery device according to claim 8, wherein said shielding layer is integrally formed on a back side of said diffuse transmission layer.

11. A solar battery device according to claim 8, wherein said shielding layer is a colorless transparent plate material having a three dimensionally shaped surface.

12. A solar battery device according to claim 8, wherein said diffuse transmission layer further includes a hindered amine light stabilizer; and
   wherein said luminescent substance includes at least one of a fluorescent material and a phosphorescent material.

13. A solar battery device according to claim 8, wherein said diffuse transmission layer includes a luminescent substance which absorbs UV light and emits visible light.

14. A solar battery device comprising:
   a diffuse transmission layer diffusing incident light on the front side of a solar battery; and
   an opaque luminescent layer, arranged successively with said diffuse transmission layer on the front side, absorbing a predetermined wavelength band of the incident light; and
   a shielding layer diffusing and reducing a quantity of light reflected by said solar battery,
   said shielding layer having an anisotropic light transmitting characteristic with different light transmittances in different directions to transmit a quantity of the incident light reaching said solar battery greater than the quantity of light reflected from said solar battery.

* * * * *